US008019578B2

(12) United States Patent
Kiso

(10) Patent No.: US 8,019,578 B2
(45) Date of Patent: Sep. 13, 2011

(54) SIMULATION METHOD OF ELECTROMAGNETIC FIELD AND CIRCUIT ANALYSIS ON FIRST AND SECOND TARGETS COUPLED TOGETHER BY A CIRCUIT ELEMENT SIMULATION APPARATUS, AND COMPUTER-READABLE MEDIUM STORING SIMULATION PROGRAM FOR PERFORMING THE METHOD

(75) Inventor: Tatsuroh Kiso, Tenri (JP)

(73) Assignee: Sharp Kabushiki Kaisha, Osaka (JP)

( * ) Notice: Subject to any disclaimer, the term of this patent is extended or adjusted under 35 U.S.C. 154(b) by 373 days.

(21) Appl. No.: 12/252,188

(22) Filed: Oct. 15, 2008

(65) Prior Publication Data

US 2009/0102470 A1  Apr. 23, 2009

(30) Foreign Application Priority Data

Oct. 16, 2007  (JP) ................. 2007-269423

(51) Int. Cl.
*G06F 17/50*  (2006.01)
(52) U.S. Cl. ............... 703/2; 703/14; 703/19; 716/111
(58) Field of Classification Search .............. 703/2, 14, 703/19; 716/5, 111
See application file for complete search history.

(56) References Cited

U.S. PATENT DOCUMENTS

| | | | |
|---|---|---|---|
| 2003/0072130 A1* | 4/2003 | Tsang et al. | 361/679 |
| 2006/0095218 A1 | 5/2006 | Sagesaka et al. | |
| 2006/0271891 A1* | 11/2006 | Rautio | 716/5 |
| 2009/0259452 A1 | 10/2009 | Takeuchi | |

FOREIGN PATENT DOCUMENTS

| | | |
|---|---|---|
| JP | 11-153634 B1 | 6/1999 |
| JP | 2004-54642 A | 2/2004 |
| JP | 2006-133994 A | 5/2006 |
| JP | 2008-217327 A | 9/2008 |
| WO | WO-2008/081544 A1 | 7/2008 |

OTHER PUBLICATIONS

"Finite Difference Time Domain Method for Electromagnetic Field and Antennas", by Toru Uno, 1st ed., Corona Publishing Co., Ltd., 1998, pp. 180-187.

* cited by examiner

*Primary Examiner* — Thai Phan
(74) *Attorney, Agent, or Firm* — Birch, Stewart, Kolasch & Birch, LLP

(57) ABSTRACT

A simulation apparatus according to an embodiment performs an electromagnetic field circuit coupling analysis on a first substrate and a second substrate electrically coupled via a circuit element having a finite delay time. A first coupling analysis unit carries out a time domain electromagnetic field analysis and also a circuit analysis on a circuit element at a first analytical domain including the first substrate. The second coupling analysis unit carries out a time domain electromagnetic field analysis and also a circuit analysis on a circuit element at a second analytical domain including the second substrate. A cable internal state analysis unit carries out a circuit analysis on a circuit element, employing an electromagnetic field value obtained at the first coupling analysis unit at one terminal of the circuit element connecting the first substrate and the circuit element, and an electromagnetic field value obtained at the second coupling analysis unit at another terminal of the circuit element connecting the second substrate and the circuit element.

9 Claims, 17 Drawing Sheets

SIMULATION METHOD OF ELECTROMAGNETIC FIELD AND CIRCUIT ANALYSIS ON FIRST AND SECOND TARGETS COUPLED TOGETHER BY A CIRCUIT ELEMENT SIMULATION APPARATUS, AND COMPUTER-READABLE MEDIUM STORING SIMULATION PROGRAM FOR PERFORMING THE METHOD

This nonprovisional application is based on Japanese Patent Application No. 2007-269423 filed with the Japan Patent Office on Oct. 16, 2007, the entire contents of which are hereby incorporated by reference.

BACKGROUND OF THE INVENTION

1. Field of the Invention

The present invention relates to a circuit/electromagnetic field analysis method obtaining a current/voltage value and electromagnetic field intensity, implemented by coupling an electromagnetic field analysis method and circuit analysis method together.

2. Description of the Background Art

There is conventionally known a circuit/electromagnetic field analysis method implemented by coupling together a finite difference time domain method of differentiating Maxwell's differential equation for solving in a time domain (hereinafter, referred to as "FDTD method") and a circuit analysis method as typified by SPICE (Simulation Program with Integrated Circuit Emphasis: built by The University of California, Berkeley), for example, to obtain a current/voltage value and electromagnetic field intensity.

In the past, various schemes have been disclosed as a simulation method of an electromagnetic wave emitted from an electronic device such as the FDTD method introduced in *Finite Difference Time Domain Method for Electromagnetic Field and Antenna*, 1st ed., 1998, by Toru Uno, CORONA PUBLISHING CO., LTD.

FIG. 12 is a diagram to describe analytical cells in the FDTD method.

The FDTD method will be briefly described with reference to FIG. 12. The FDTD method employs an analytical domain that includes components such as a printed circuit board and cavity of an electronic device as well as the ambient space. The analytical domain is divided into small cuboids called cells, as shown in FIG. 12. At this stage, the permeability, permittivity and conductivity depending on the substance constituting the cell are applied to each cell. As used herein, the length of each side of the cell in the x, y and z directions are set as $\Delta x$, $\Delta y$ and $\Delta z$, respectively.

Then, respective x, y and z components of either the electric field intensity E or magnetic field intensity H that are vector quantities, for example, ($E_x$, $E_y$, $E_z$) of the electric field intensity, are arranged on each side of the cell lattice, whereas respective components of x, y and z of the other magnetic field intensity, for example, ($H_x$, $H_y$, $H_z$) are arranged at the center of the lattice plane of the cell, perpendicular to the lattice plane.

By employing the central difference for the time and space in the differential Maxwell's equation, the following two expressions are given:

$$E^n = \frac{1 - \frac{\sigma \Delta t}{2\varepsilon}}{1 + \frac{\sigma \Delta t}{2\varepsilon}} E^{n-1} + \frac{\frac{\Delta t}{\varepsilon}}{1 + \frac{\sigma \Delta t}{2\varepsilon}} \nabla \times H^{n-\frac{1}{2}} \quad \text{Expression (1)}$$

$$H^{n+\frac{1}{2}} = H^{n-\frac{1}{2}} - \frac{\Delta t}{\mu} \nabla \times E^n \quad \text{Expression (2)}$$

where $\sigma$, $\varepsilon$ and $\mu$ represent the conductivity, permittivity and permeability, respectively, and $\Delta t_{em}$ represents the time step in calculation.

The procedure of obtaining the electric field intensity and magnetic field intensity corresponding to time elapse in the FDTD method will be described hereinafter.

With $\Delta t_{em}$ as the time step width, it is assumed that the electric field intensity $E^{n-1}$ at time $(n-1) \Delta t_{em}$ and the magnetic field intensity $H^{n-1/2}$ at time $(n-\frac{1}{2}) \Delta t_{em}$ are given. The electric field intensity $E^{n-1}$ at time $n\Delta t_{em}$ is calculated by assigning $E^{n-t}$ and $H^{n-1/2}$ to Expression (1). For the magnetic field intensity, $H^{n+1/2}$ is calculated by assigning $E^n$ and $H^{n-1/2}$ to Expression (2) at time $(n+\frac{1}{2})\Delta t_{em}$. Thus, electric field intensity E and magnetic field intensity H are calculated alternately in time in the FDTD method.

At this stage, the time step width $\Delta t_{em}$ in the FDTD method must satisfy the Courant stability condition shown in Expression (3) with respect to the cell size.

$$\Delta t_{em} \leq \frac{1}{c\sqrt{\left(\frac{1}{\Delta x}\right)^2 + \left(\frac{1}{\Delta y}\right)^2 + \left(\frac{1}{\Delta z}\right)^2}} \quad \text{Expression (9)}$$

where c is the light velocity. It is generally known that the calculated value will be diffused if Expression (3) is not satisfied for time step width $\Delta t_{em}$.

Since the FDTD method is an analysis method of a closed domain, there is a drawback that reflectance will occur at the outer wall of the analytical domain when an open domain problem is handled. In view of this drawback, a virtual boundary called an absorption boundary must be provided to avoid reflectance at the outer wall of the analytical domain. In the aforementioned *Finite Difference Time Domain Method for Electromagnetic Field and Antenna*, various proposals for absorption boundary conditions are introduced.

As a tool for analyzing the transient state of an electrical circuit including a non-linear element, a circuit simulator as typified by SPICE is generally employed. Moreover, libraries covering a great amount of subcircuits including integrated circuits are provided by manufacturers, software companies, academia parties, and the like.

The analysis method in a circuit simulator of SPICE and the like will be briefly described. First, a non-linear simultaneous differential equation is derived by applying a modified nodal analysis method to a net list in which are described the connection information between circuit elements and parameters of the circuit elements with the current/voltage value at the nodes of the circuit that is the target of analysis as variables. This non-linear simultaneous differential equation is converted into an algebraic equation employing the difference in the time domain and Newton's iteration method. By solving this algebraic equation, the circuit current/voltage value at the analysis time can be obtained. Then, the analysis time is stepped up by just the difference in the time domain. By repeating the computation set forth above, the transient state of the circuit voltage/current is worked out.

The aforementioned *Finite Difference Time Domain Method for Electromagnetic Field and Antenna* and Japanese Patent Laying-Open No. 11-153634 disclose an analysis method implemented by coupling the aforementioned FDTD method and circuit simulator such as SPICE together in a time domain to analyze the electromagnetic field intensity and circuit transient response of an analytical domain including a non-linear circuit element.

FIG. 13 is a conceptual diagram representing the coupling of the FDTD method with a circuit simulator.

In the aforementioned *Finite Difference Time Domain Method for Electromagnetic Field and Antenna*, a hybrid method based on an equivalent current source method and equivalent voltage source method is described. The equivalent current source method will be described here. It is assumed that ports provided across the two terminals of an element that is to be analyzed by a circuit simulator are present in one cell parallel to the z-axis. Ampere's law represented in Expression (4) can be rewritten as Expression (5) for an FDTD cell including an element port.

$$\varepsilon \frac{dE}{dt} + J(E) = \nabla \times H \qquad \text{Expression (4)}$$

$$C \frac{dV}{dt} + I(V) = I \qquad \text{Expression (5)}$$

As used herein, V is the voltage applied to the chip, $C = \varepsilon A/\Delta_z$ is the electrostatic capacitance of the FDTD cell ($A = \Delta x \cdot \Delta y$ is the area and $\Delta z$ is the height of the FDTD cell), $I(V)(=A \cdot J(E))$ is the current flowing through the port, and I is the total cell current $A \cdot \nabla \times H$.

Namely, the coupling of the FDTD method and circuit simulator is represented by an equivalent circuit such as a capacitor C, a constant current source I, and elements, connected in parallel.

FIG. 14 is a conceptual diagram of the data flow in the FDTD method and circuit simulator over time.

Data transfer between the FDTD method and circuit simulator in the equivalent current source method will be described with reference to FIG. 14.

It is assumed that electric field intensity $E^{n-1}$ at time $(n-1)\Delta t_{em}$ and magnetic field intensity $H^{n-3/2}$ at time $(n-3/2)\Delta t_{em}$ are given. Magnetic field intensity $H^{n-1/2}$ at time $(n-1/2)\Delta t_{em}$ is obtained by assigning $E^{n-1}$ and $H^{n-3/2}$ to Expression (2).

It is to be noted that the method of calculating electric field intensity $E^n$ at time $n\Delta t_{em}$ differs between a cell that includes an element and a cell that does not include an element. With regards to the cell that does not include the element, electric field intensity $E^n$ can be obtained by assigning $E^{n-1}$ and $H^{n-1/2}$ into Expression (1). With regards to the cell that includes the element, electric field intensity $E^n$ is calculated by a circuit analysis through a circuit simulator.

In the equivalent circuit of FIG. 13, circuit simulation is performed with a sufficiently fine time step width from time $(n-1)\Delta t_{em}$ to time $n\Delta t_{em}$ on condition $V^{n-1} = E_z^{n-1} \Delta z$ as the initial voltage value of the capacitor, and a constant value $I = A \cdot \nabla \times H^{n-1/2}$ as the equivalent current source. The element voltage value $V^n$ at time $n\Delta t_{em}$ is converted into electric field intensity $E_z^n = V^n/\Delta z$ of the cell including an element, and passed over to the FDTD method.

Similarly in the equivalent voltage source method, analysis is carried out including the steps of obtaining the equivalent voltage source value from the electric field obtained by the FDTD method, analyzing through a circuit simulator, the current value at the time of obtaining the magnetic field by the FDTD method, converting the result into a magnetic field value, and passing over the same to the FDTD method.

Thus, analysis is carried out with the electromagnetic field intensity by the FDTD method and the current/voltage value by the circuit simulator set in correspondence in the hybrid method.

Moreover, Japanese Patent Laying-Open No. 11-153634 proposes a method for realizing data transfer between the FDTD method and circuit simulator when the aforementioned hybrid method employs time steps that can be increased and decreased in a circuit simulator.

FIGS. 15A and 15B represent equivalent circuits of items.

For an equivalent circuit of a 2-terminal item, a circuit/electromagnetic field coupling analysis implemented by coupling circuit analysis and electromagnetic field analysis together can be carried out by setting one port between the circuit analysis and electromagnetic field analysis, as set forth above. Furthermore, by setting two or more ports even in an equivalent circuit of an item having three or more terminals as shown in FIG. 15A, a circuit/electromagnetic field coupling analysis can be carried out similarly as a circuit as shown in FIG. 15B.

According to the method set forth above, a coupling analysis of analyzing at the same time the electromagnetic field distribution in one electromagnetic field analysis space, and the current and voltage of a circuit item present thereon can be realized by coupling the FDTD method and circuit simulator together.

FIG. 16 is a conceptual diagram of the configuration of a general electronic device product, viewed from the side.

A general electronic device product is often based on a configuration in which the internal circuit required for the operation of the product is allotted to a plurality of substrates that are connected through cables. In such a configuration, the signal quality and/or noise radiation at the lines of signals running over the two substrates and the cables establishing connection therebetween often becomes an issue. Accordingly, there is a need to perform a simulation on such signal lines.

FIG. 17 is a conceptual diagram to describe a circuit simulation with respect to the electronic device product shown in FIG. 16.

Consider the case of performing a simulation on the cable (signal line) as shown in FIG. 16, using the technique disclosed in the aforementioned *Finite Difference Time Domain Method for Electromagnetic Field and Antenna* and Japanese Patent Laying-Open No. 11-153634. Since it is necessary to dispose two substrates within the same electromagnetic field analytical domain, as shown in FIG. 17, electromagnetic field analysis has to be carried out for the space between the substrates even in the case where the mutual electromagnetic field effect between the substrates through space excluding the cable is considered to be small. Further, because of the same electromagnetic field analysis space, an analysis of the entire space must be carried out with a cell size and time step corresponding to the smaller substrate even in the case where the fineness of the substrates differ from each other. Therefore, more computation resource than needed will be consumed during the analysis calculation.

SUMMARY OF THE INVENTION

The present invention aims to solve the problem set forth above. An object of the present invention is to provide a simulation method that can perform efficiently a coupling analysis on an electronic device that has a plurality of substrates connected by a circuit element, for example, by a cable, a simulation apparatus, and a computer readable medium storing the simulation program.

According to an aspect of the present invention, there is provide a simulation method for executing an electromagnetic field circuit coupling analysis on a first target of analysis and a second target of analysis, electrically coupled via a circuit element having a finite delay time. The simulation method includes: a first electromagnetic field analysis step of carrying out a time domain electromagnetic field analysis at a first analytical domain including the first target of analysis; a first circuit analysis step of carrying out a circuit analysis on the circuit element at the first analytical domain, implemented by coupling with the first electromagnetic field analysis step; a second electromagnetic field analysis step of carrying out a time domain electromagnetic field analysis at a second analytical domain including the second target of analysis; a second circuit analysis step of carrying out a circuit analysis on the circuit element at the second analytical domain, implemented by coupling with the second electromagnetic field analysis step; a third circuit analysis step of carrying out a circuit analysis on the circuit element, employing an electromagnetic field value obtained at the first electromagnetic field analysis step, at one terminal of the circuit element connecting the first target of analysis and the circuit element, and an electromagnetic field value obtained at the second electromagnetic field analysis step at an other terminal of the circuit element connecting the second target of analysis and the circuit element; and a coupling step of replacing an internal state at the first circuit analysis step and the second circuit analysis step with the internal state calculated at the third circuit analysis step.

Preferably, the simulation method further includes a first conversion step of converting bidirectionally an electric field value or magnetic field value obtained at the first electromagnetic field analysis step to a voltage value or current value, at one terminal of the circuit element connecting the first target of analysis and the circuit element; a first storage step of storing the electric field value or magnetic field value obtained at the first electromagnetic field analysis step, or the voltage value or current value obtained at the first conversion step, at one terminal of the circuit element connecting the first target of analysis and the circuit element; a second conversion step of converting bidirectionally an electric field value or magnetic field value obtained at the second electromagnetic field analysis step to a voltage value or current value, at an other terminal of the circuit element connecting the second target of analysis and the circuit element; and a second storage step of storing the electric field value or magnetic field value obtained at the second electromagnetic field analysis step, or the voltage value or current value obtained at the second conversion step, at one terminal of the circuit element connecting the second target of analysis and the circuit element. The third circuit analysis step includes carrying out the circuit analysis on the circuit element, based on the information of the two terminals stored at the first and second storage steps.

Preferably, the time domain electromagnetic field analysis is executed employing the FDTD method.

According to another aspect of the present invention, there is provided a simulation apparatus that performs an electromagnetic field circuit coupling analysis on a first target of analysis and a second target of analysis, electrically coupled via a circuit element having a finite delay time. The simulation apparatus includes: a first electromagnetic field analysis unit carrying out a time domain electromagnetic field analysis at a first analytical domain including the first target of analysis; a first circuit analysis unit carrying out a circuit analysis on the circuit element at the first analytical domain, coupled with the first electromagnetic field analysis unit; a second electromagnetic field analysis unit carrying out a time domain electromagnetic field analysis at a second analytical domain including the second target of analysis; a second circuit analysis unit carrying out a circuit analysis on the circuit element at the second analytical domain, coupled with the second electromagnetic field analysis unit; a third circuit analysis unit carrying out a circuit analysis on the circuit element, employing an electromagnetic field value obtained at the first electromagnetic field analysis unit at one terminal of the circuit element connecting the first target of analysis and the circuit element, and an electromagnetic field value obtained at the second electromagnetic field analysis unit at an other terminal of the circuit element connecting the second target of analysis and the circuit element; and a coupling unit replacing an internal state of the first circuit analysis unit and second circuit analysis unit with the internal state calculated at the third circuit analysis unit.

According to a further aspect of the present invention, there is provided a computer-readable medium storing a simulation program for executing an electromagnetic field circuit coupling analysis on a first target of analysis and a second target of analysis, electrically coupled via a circuit element having a finite delay time. The simulation program causes a computer to execute: a first electromagnetic field analysis step of carrying out a time domain electromagnetic field analysis at a first analytical domain including the first target of analysis; a first circuit analysis step of carrying out a circuit analysis on the circuit element at the first analytical domain, implemented by coupling with the first electromagnetic field analysis step; a second electromagnetic field analysis step of carrying out a time domain electromagnetic field analysis at a second analytical domain including a second target of analysis; a second circuit analysis step of carrying out a circuit analysis on the circuit element at the second analytical domain, implemented by coupling with the second electromagnetic field analysis step; a third circuit analysis step of carrying out a circuit analysis on the circuit element, employing an electromagnetic field value obtained at the first electromagnetic field analysis step, at one terminal of the circuit element connecting the first target of analysis and the circuit element, and an electromagnetic field value obtained at the second electromagnetic field analysis step at an other terminal of the circuit element connecting the second target of analysis and the circuit element; and a coupling step of replacing an internal state of the first circuit analysis step and the second circuit analysis step with the internal state calculated at the third circuit analysis step.

According to the present invention, an electromagnetic wave emitted from a cable connected to a circuit substrate can be analyzed efficiently.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
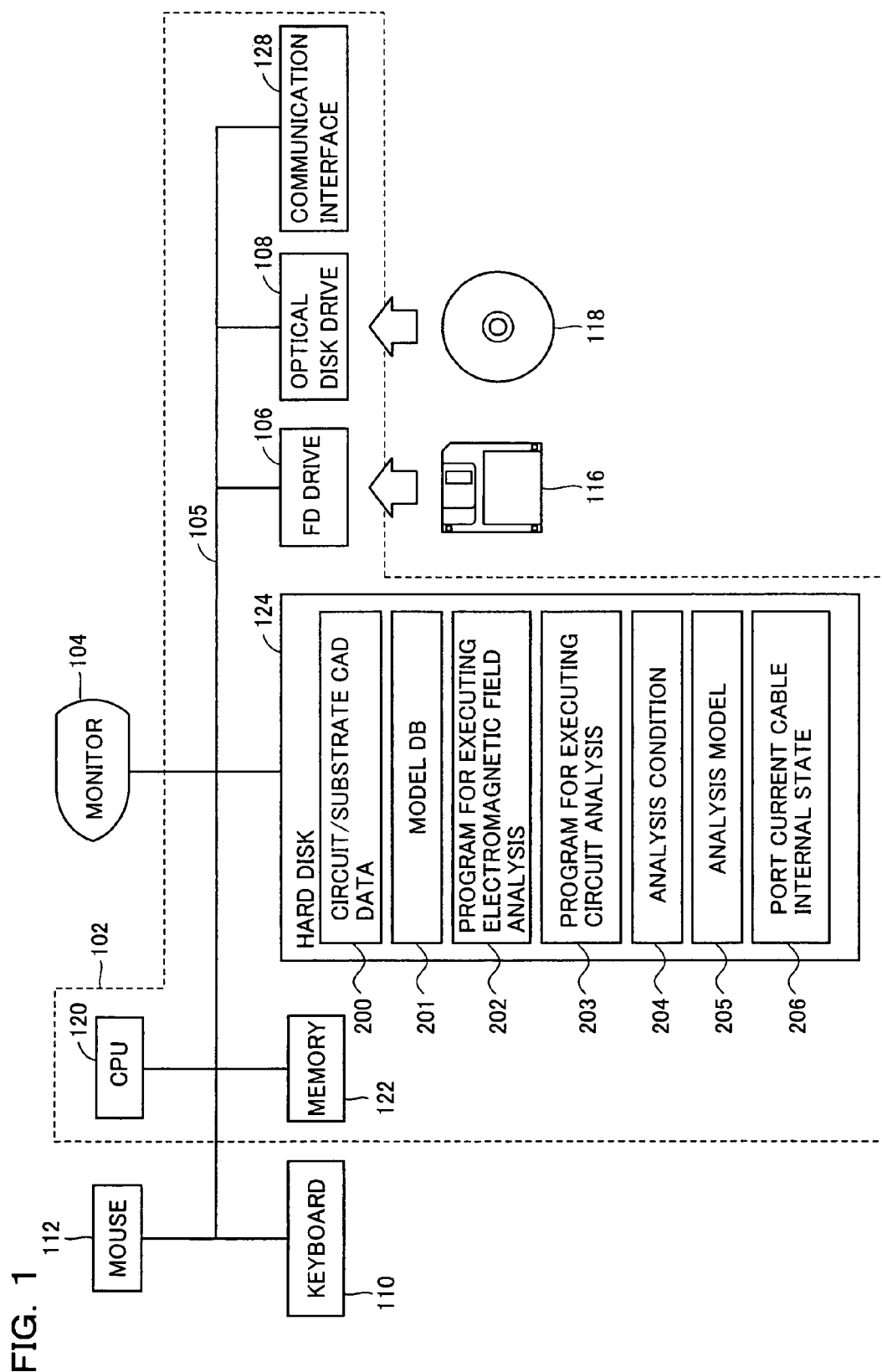
FIG. 1 is a block diagram of a configuration of a simulation apparatus according to an embodiment.

Embodiments of the present invention will be described hereinafter with reference to the drawings. In the following description, same reference characters are allotted to the same items. Their label and function are also identical. Therefore, detailed description thereof will not be repeated.

It will become apparent from the following description that a simulation apparatus functioning as a coupling analysis apparatus of the present invention effectively calculates an electromagnetic wave emitted from a cable in an electronic device having a plurality of substrates coupled through a cable.

Referring to FIG. 1, a configuration of a simulation apparatus 100 according to an embodiment will be described.

Simulation apparatus 100 includes a computer main unit 102, an FD drive 106, connected with computer main unit 102 through a bus 105 to read/write information with respect to a flexible disk (hereinafter, also referred to as "FD"), an optical disk drive 108 for reading in information on an optical disk such as a CD-ROM (Compact Disc Read-Only Memory) 118, a communication interface 128 to transmit and receive data with respect to an external source, a monitor 104 serving as a display device, and a keyboard 110 and a mouse 112 serving as input devices. Computer main unit 102 includes a CPU (Central Processing Unit) 120 connected to bus 105, a memory 122 including a ROM (Read Only Memory) and a RAM (Random Access Memory), and a direct access memory device such as a hard disk 124.

Hard disk 124 includes a circuit/substrate CAD data storage unit 200, a model database (hereinafter, referred to as "model DB") 201, a program 202 for executing an electromagnetic field analysis, a program 203 for executing a circuit analysis, an analysis condition storage unit 204 in which a condition to carry out an analysis is stored, an analysis model storage unit 205 for storing an analysis model for an electromagnetic field analysis, and a port current cable internal state storage unit 206 for storing an intermediate result during each analysis. Circuit/substrate CAD data storage unit 200 stores parameters or the like representing the shape of the circuit substrate that is the target of analysis, and physical properties such as the permittivity of the medium constituting the substrate. Model DB 201 stores an equivalent circuit model corresponding to each item arranged on the circuit substrate. Although not shown, the eventual result of analysis is also stored in hard disk 124.

In the present invention, circuit/substrate CAD data storage unit 200, model DB 201, and analysis condition storage unit 204 may be supplied from an external database via communication interface 128. The program for performing a simulation of the present invention may be supplied through a storage medium such as FD 116, CD-ROM 118, or the like, or may be supplied from another computer through a communication line. The electromagnetic field analysis and circuit analysis may be executed by means of an external computer through communication interface 128, from which the result is stored in hard disk 124.

CPU 120 functioning as a processing unit executes a process corresponding to each program set forth above with memory 122 as the working memory.

CD-ROM 118 may be another type of medium such as a DVD-ROM (Digital Versatile Disc) or memory card, as long as information such as a program to be installed in the computer main unit can be recorded. In such a case, a drive device that can read out from such a medium is provided at computer main unit 102. Further, a magnetic tape device loaded with a cassette type magnetic tape in a detachable manner may be connected onto bus 105.

As mentioned above, the program for performing a simulation of the present invention is implemented in software executed by CPU 120. Such software is generally stored in a storage medium such as a CD-ROM 118 or FD 116 for distribution. The program is read out from the storage medium by optical disk drive 108 or FD drive 106 to be temporarily stored in hard disk 124. In the case where a computer is connected onto the network, the program is copied from a server on the network to be stored temporarily in hard disk 124. Then, the program is read out from hard disk 124 to a RAM in memory 122 to be executed by CPU 120. In the case where network connection is established, the program may be directly loaded to the RAM without being stored in hard disk 124 for execution.

The computer hardware per se and the operational principle shown in FIG. 1 are general ones. Therefore, the substantial elements for providing the feature of the present invention corresponds to software stored in a storage medium such as FD 116, CD-ROM 118, hard disk 124, and the like.

Figure 2:
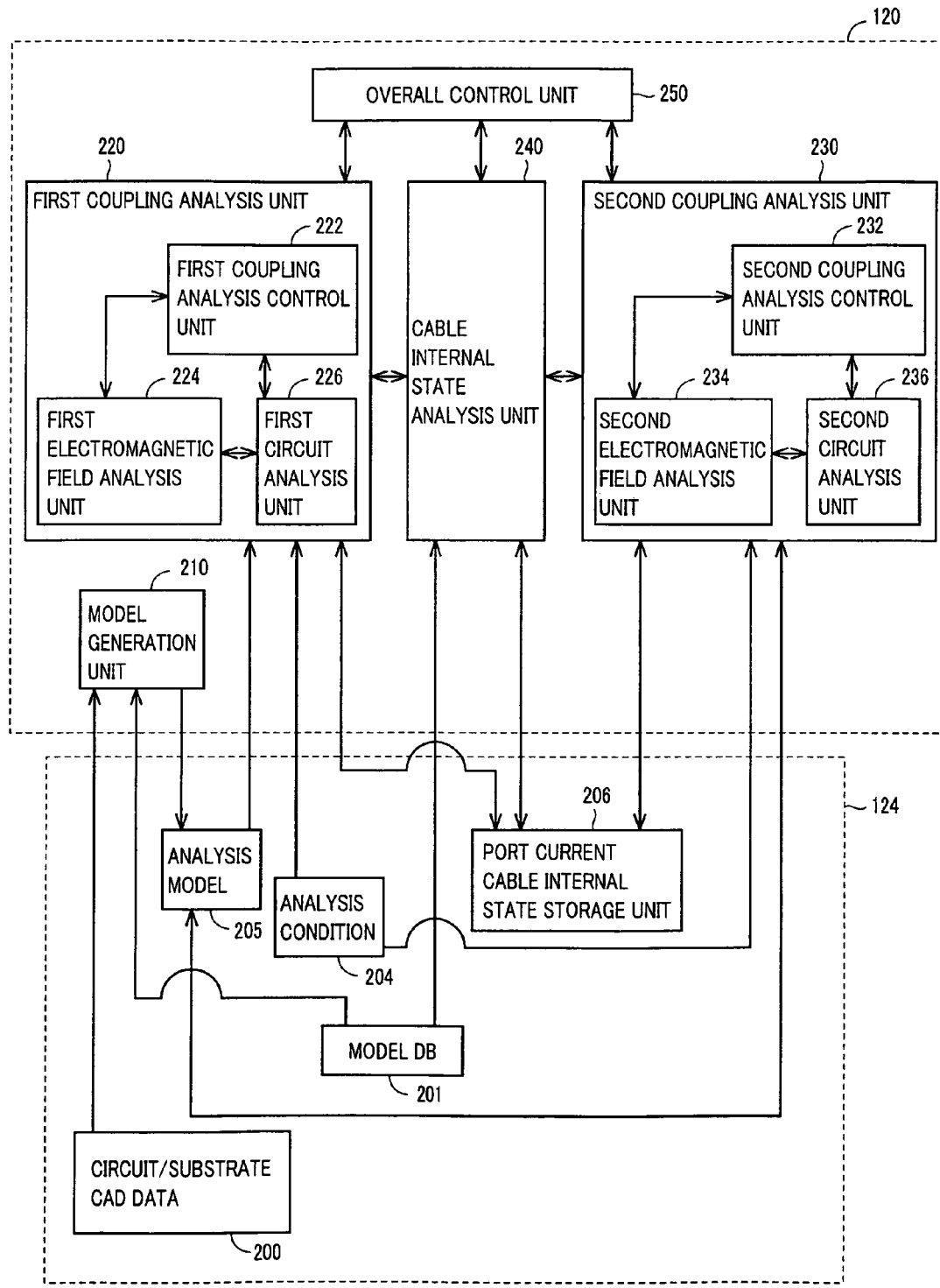
FIG. 2 is a block diagram representing a functional configuration of a CPU.

FIG. 2 is a functional block diagram of a functional configuration of CPU 120.

Referring to FIG. 2, the functional configuration of the process carried out by CPU 120 will be described. The description hereinafter is based on the case where there are two circuit substrates. The present invention is also applicable to the case where there are more circuit substrates by adding a similar functional block for each circuit substrate and connection cable.

CPU 120 includes a model generation unit 210 generating an analysis model of the apparatus (circuit substrate), a first coupling analysis unit 220, a second coupling analysis unit 230, a cable internal state analysis unit 240, and an overall control unit 250 for the control of each analysis. First coupling analysis unit 220 performs an electromagnetic field analysis and circuit analysis implemented by coupling together, on the first circuit substrate according to program 202 for executing an electromagnetic field analysis and program 203 for executing a circuit analysis. Second coupling analysis unit 230 performs an electromagnetic field analysis and circuit analysis implemented by coupling together, on the second circuit substrate according to program 202 for executing an electromagnetic field analysis and program 203 for executing a circuit analysis. Cable internal state analysis unit 240 carries out an analysis on the cable internal state, implemented by first coupling analysis unit 220 and second coupling analysis unit 230 that are coupling together.

Model generation unit 210 reads out CAD design data, structural information of each constituent element, and physical property values from circuit/substrate CAD data storage unit 200 and/or model DB 201 to develop three dimensional structural information. Model generation unit 210 stores the developed three-dimensional structural information in analysis model storage unit 205. In the case where a printed circuit board, for example, is the target of analysis, model generation unit 210 develops three-dimensional structural information by reading out the physical property values of the substance constituting a substrate formed of a dielectric and a substrate formed of a conductor and the like, two-dimensional structural information of each substance in each layer, and structural information in the direction of the stacked layers (thickness direction) of the printed circuit board.

First coupling analysis unit 220 includes a first coupling analysis control unit 222 for controlling the coupling analysis processing of an electromagnetic field analysis and circuit analysis on a first circuit substrate, a first electromagnetic field analysis unit 224 executing an electromagnetic field analysis under control of first coupling analysis control unit 222, and a first circuit analysis unit 226 executing a circuit analysis under control of first coupling analysis control unit 222.

Second coupling analysis unit 230 includes a second coupling analysis control unit 232 controlling the coupling analysis processing of an electromagnetic field analysis and circuit analysis on a second circuit substrate, a second electromagnetic field analysis unit 234 executing an electromagnetic field analysis under control of second coupling analysis control unit 232, and a second circuit analysis unit 236 executing a circuit analysis under control of second coupling analysis control unit 232.

Figure 12:
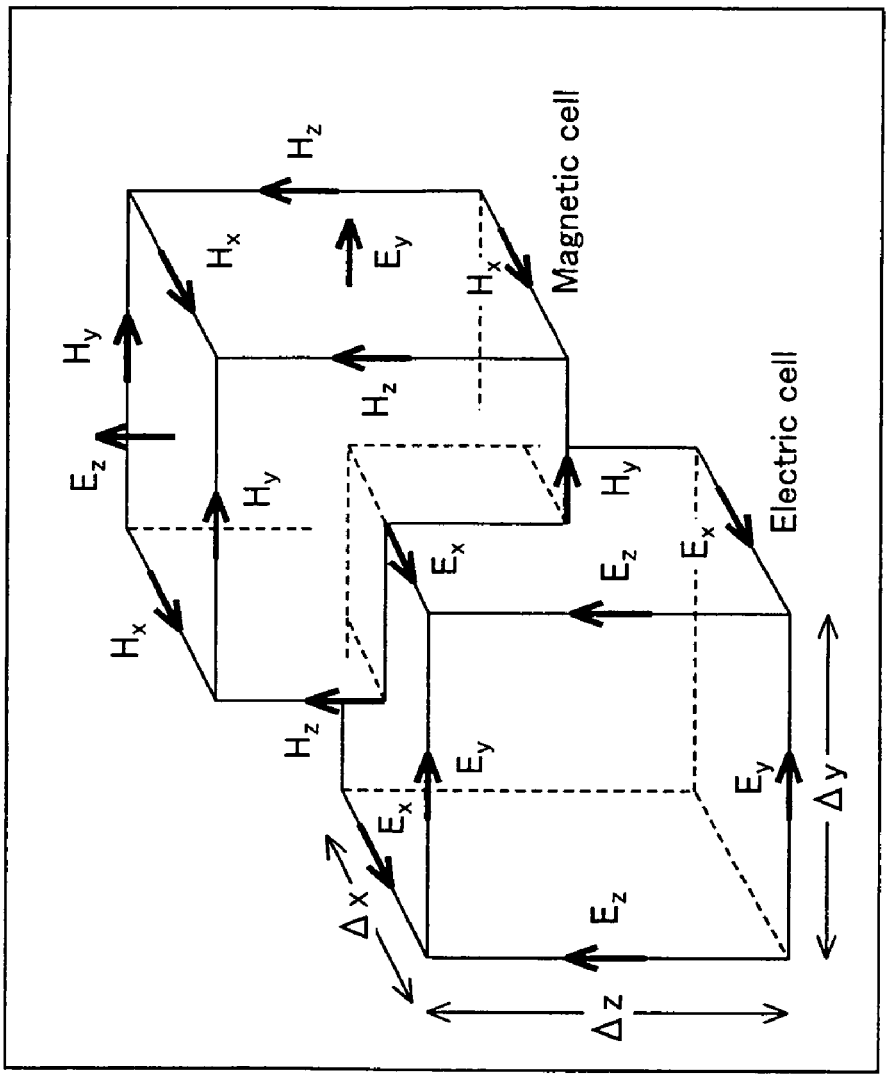
FIG. 12 is a diagram for describing an analytical cell of the FDTD method.
Figure 13:
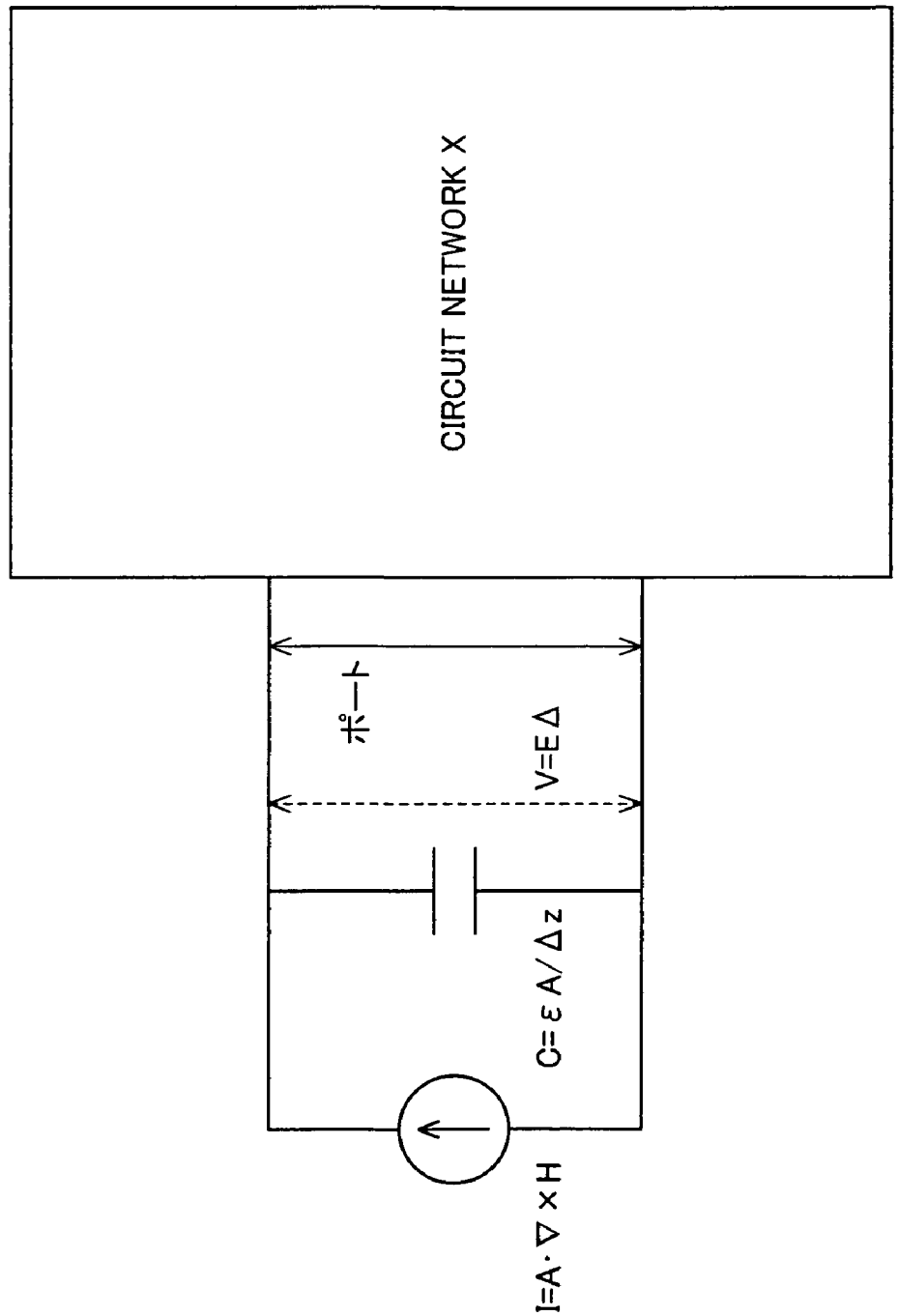
FIG. 13 is a conceptual diagram representing the coupling of the FDTD method and circuit simulator.
Figure 14:
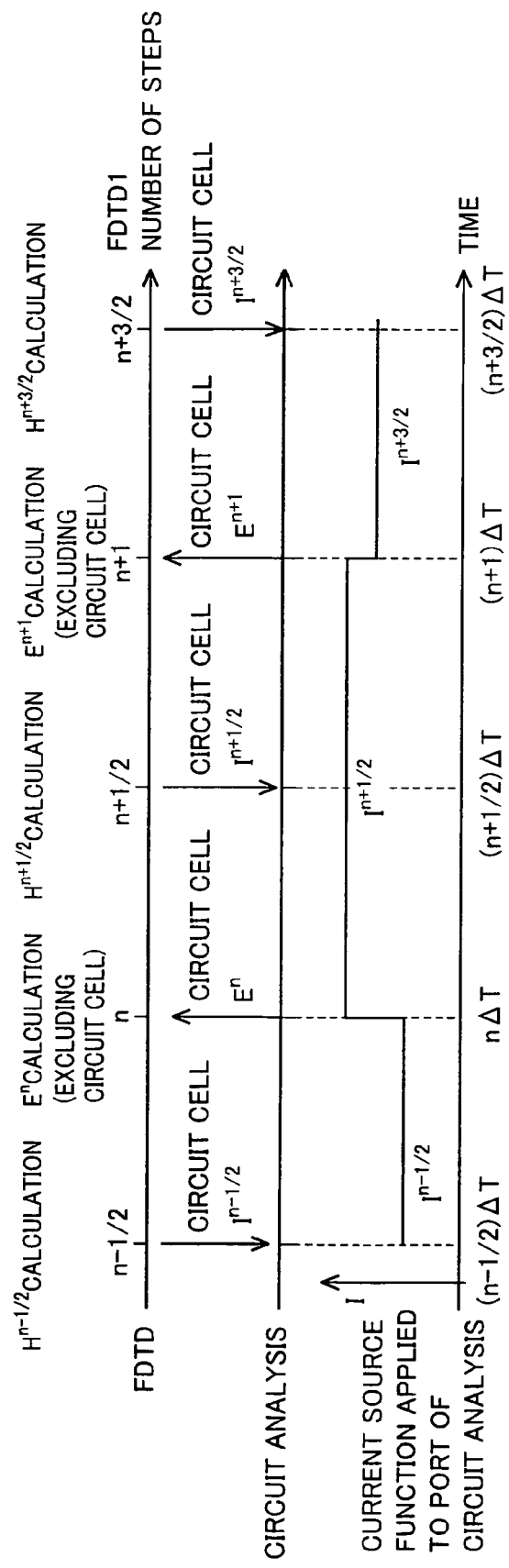
FIG. 14 is a conceptual diagram representing data flow between the FDTD method and circuit simulator over time.
Figure 15B:
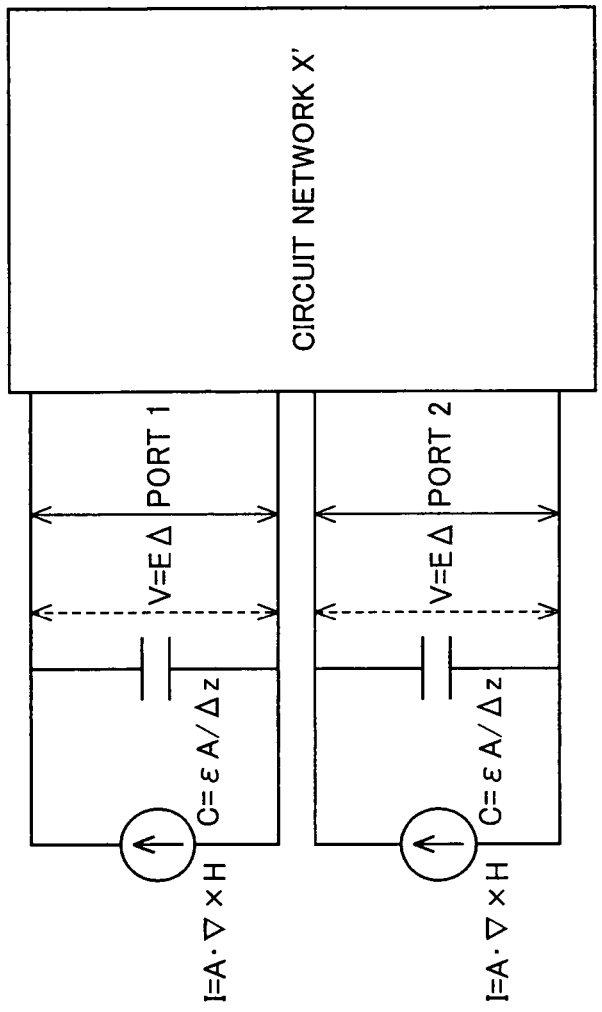
FIGS. 15A and 15B represent equivalent circuits of an item.
Figure 15A:
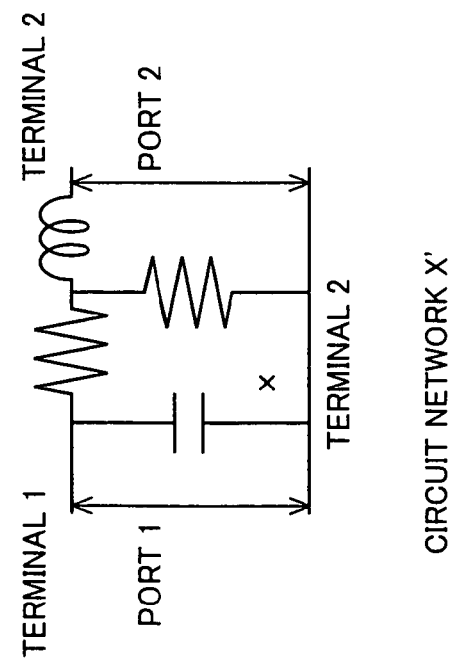

First electromagnetic field analysis unit 224 reads out data from analysis condition storage unit 204 and/or analysis model storage unit 205 to carry out an electromagnetic field analysis on the first circuit substrate. Then, first electromagnetic field analysis unit 224 writes the analyzed result into port current cable internal state storage unit 206. In the present embodiment, an electromagnetic field analysis is executed by the FDTD method. In the FDTD method, an analysis is carried out based on a structure called a Yee grid in which a grid corresponding to an arrangement of an unknown electric field and a grid corresponding to an arrangement of an unknown magnetic field are staggered by just half a width of the grid, as shown in FIG. 12. The FDTD method is an analysis method to obtain the entire electromagnetic field behavior by deriving a relational equation that relates the unknown electric field and magnetic field to an adjacent unknown magnetic field and electric field by differentiating Maxwell's electromagnetic field equation, and updating the unknown electric field and magnetic field based on the derived equation on a time-step basis. According to this analysis method, the electric field is updated at a certain time step, the magnetic field is updated at half a time step later, the electric field is updated at one time step later, and so on, to obtain an electric field and a magnetic field alternately.

Analysis condition storage unit 204 includes terminal signal labels, the grid cell dimension, the time step in the FDTD analysis, and the like.

First circuit analysis unit 226 reads out the substrate CAD data describing the wiring structure of signals, and an equivalent circuit of the element related to the relevant signal from circuit/substrate CAD data storage unit 200 and model DB 201 to execute a circuit analysis on the first circuit substrate. Then, first circuit analysis unit 226 writes the analysis result into port current cable internal state storage unit 206.

Second electromagnetic field analysis unit 234 and second circuit analysis unit 236 carry out an analysis similar to that of first electromagnetic field analysis unit 224 and first circuit analysis unit 226, respectively, on the second circuit substrate.

Cable internal state analysis unit 240 executes a circuit analysis on a cable based on the analysis result on a cable port 1 by first coupling analysis unit 220 and the analysis result on a cable port 2 by second coupling analysis unit 230.

Overall control unit 250 controls the process executed by first coupling analysis unit 220, second coupling analysis unit 230, and cable internal state analysis unit 240.

Figure 3:
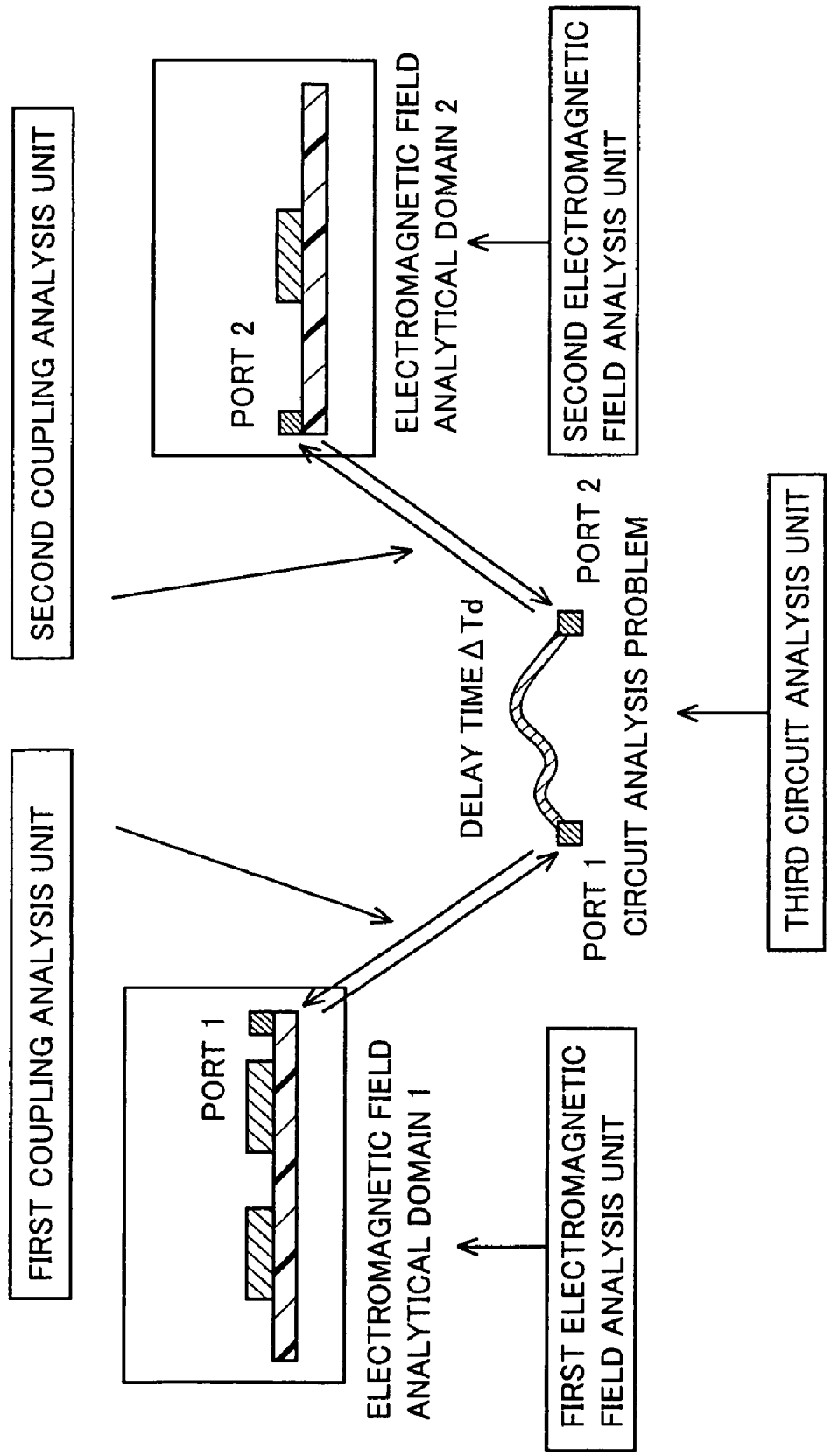
FIG. 3 is a conceptual diagram representing the concept of the coupling analysis procedure of the present invention.

FIG. 3 is a conceptual diagram representing the concept of a coupling analysis procedure of the present invention.

Figure 16:
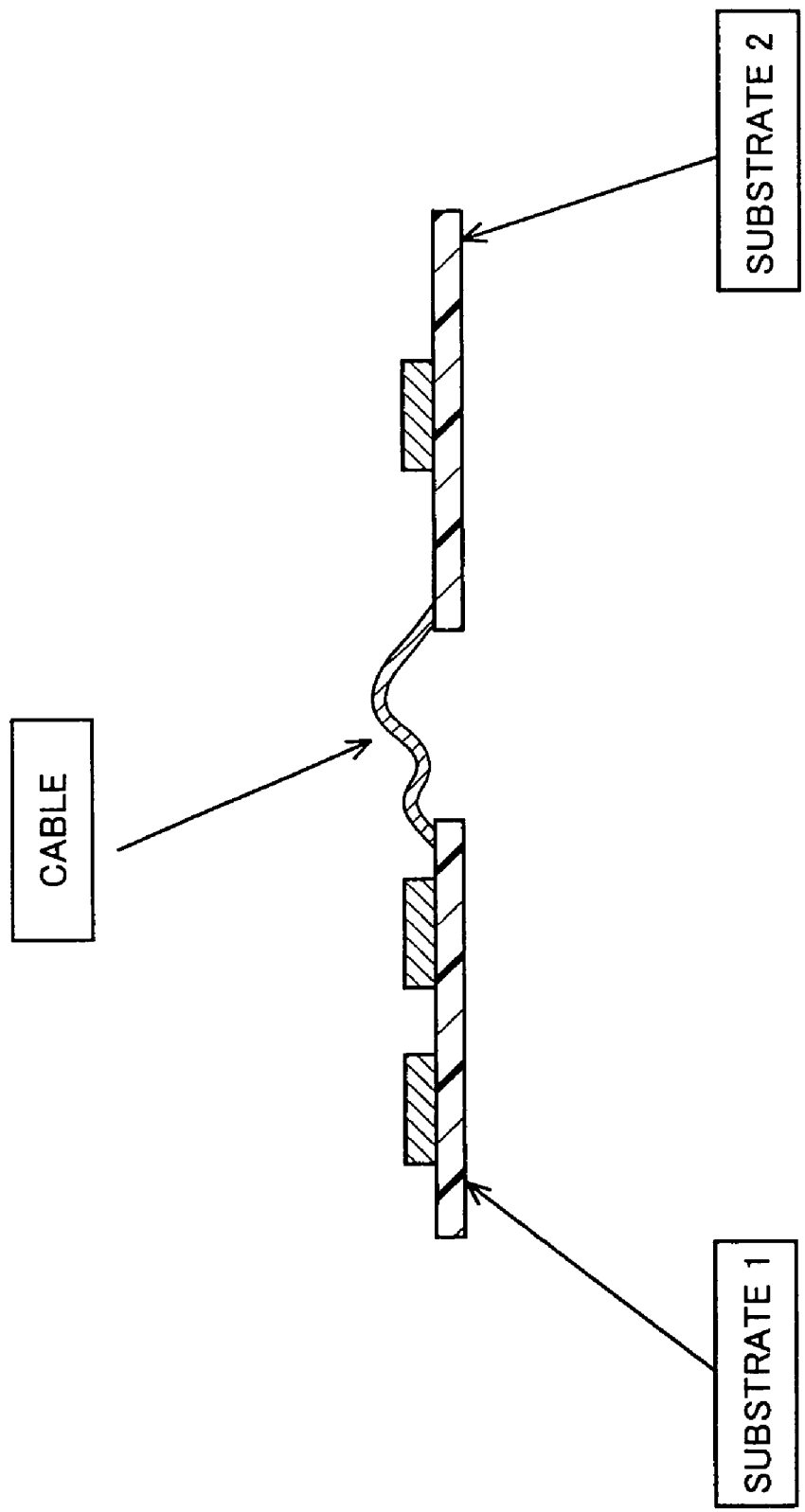
FIG. 16 is a conceptual diagram of a configuration of a general electronic device product, viewed from the side.
Figure 17:
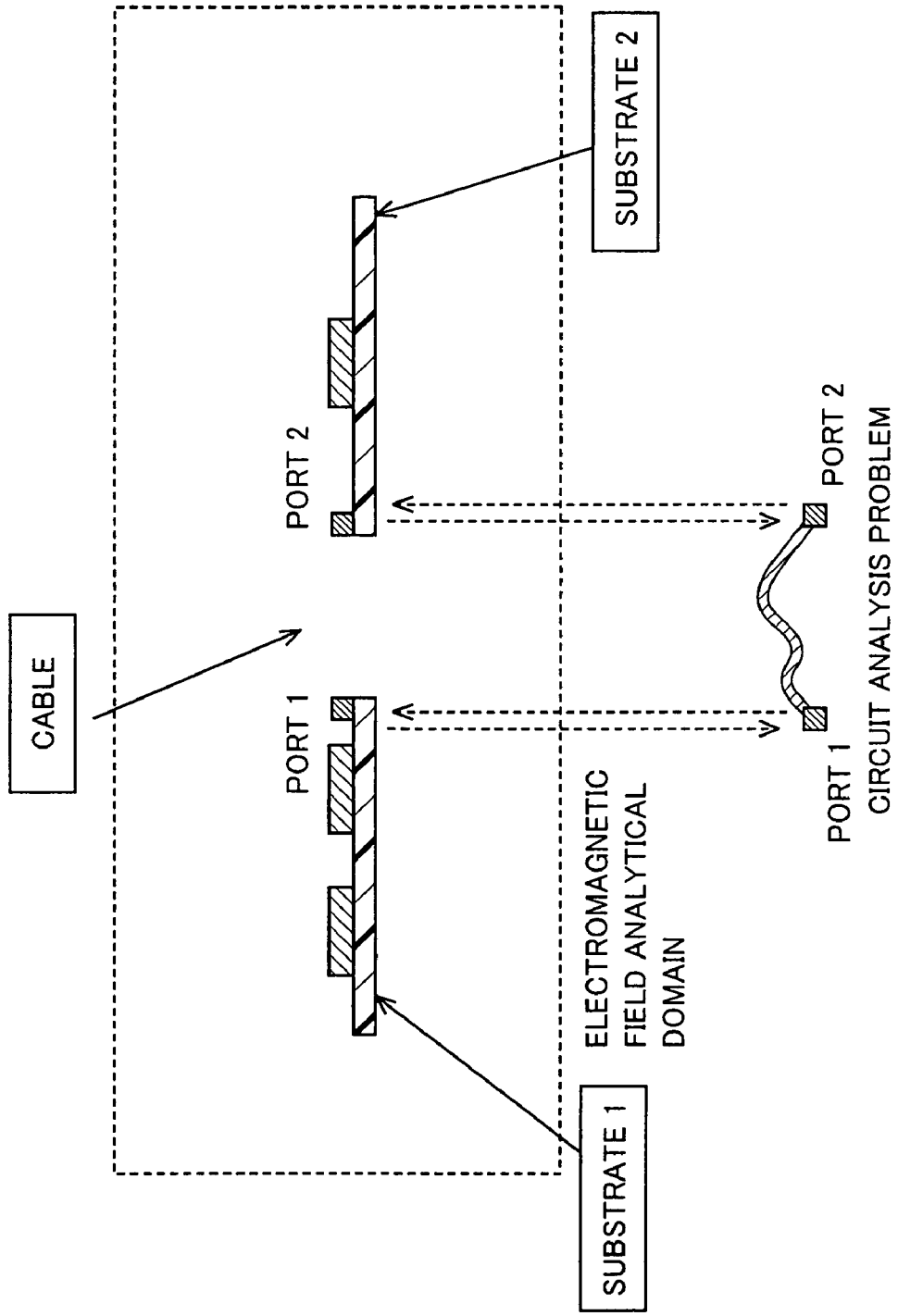
FIG. 17 is a conceptual diagram to describe a circuit simulation on the electronic device product of FIG. 16.

Referring to FIG. 3, the first substrate and second substrate are divided into an electromagnetic field analytical domain 1 and an electromagnetic field analytical domain 2 that are individual analysis spaces for a target of analysis such as that shown in FIG. 16. Further, one port 1 of the circuit analysis problem with respect to the same cable is arranged on the first substrate and the other port 2 is arranged on the second substrate. For the circuit analysis problem of a cable having a port at both of electromagnetic field analytical domains 1 and 2 that are two analysis spaces, the circuit analysis model complies with the property of the cable of a finite length that is actually present. Therefore, there is a delay of a finite time $\Delta Td0$ before the voltage and current change at one of the two ports affects the other port. In view of this delay, time $\Delta Td$ corresponding to $0 < \Delta Td < \Delta Td0$ is introduced, and the entire analysis time is divided into the analysis time range of $$i\Delta Td \leq t \leq (i+1)\Delta Td (i=0, 1, 2, \ldots).$$

Accordingly, if the internal state of the circuit analysis at the initial time $\Delta Td$ in the range of each divided analysis time range is correct, an operation of information coupling at just one port will allow an analysis on the ports during the relevant time range to be carried out properly regardless of whatever value is applied to the other port.

Figure 4:
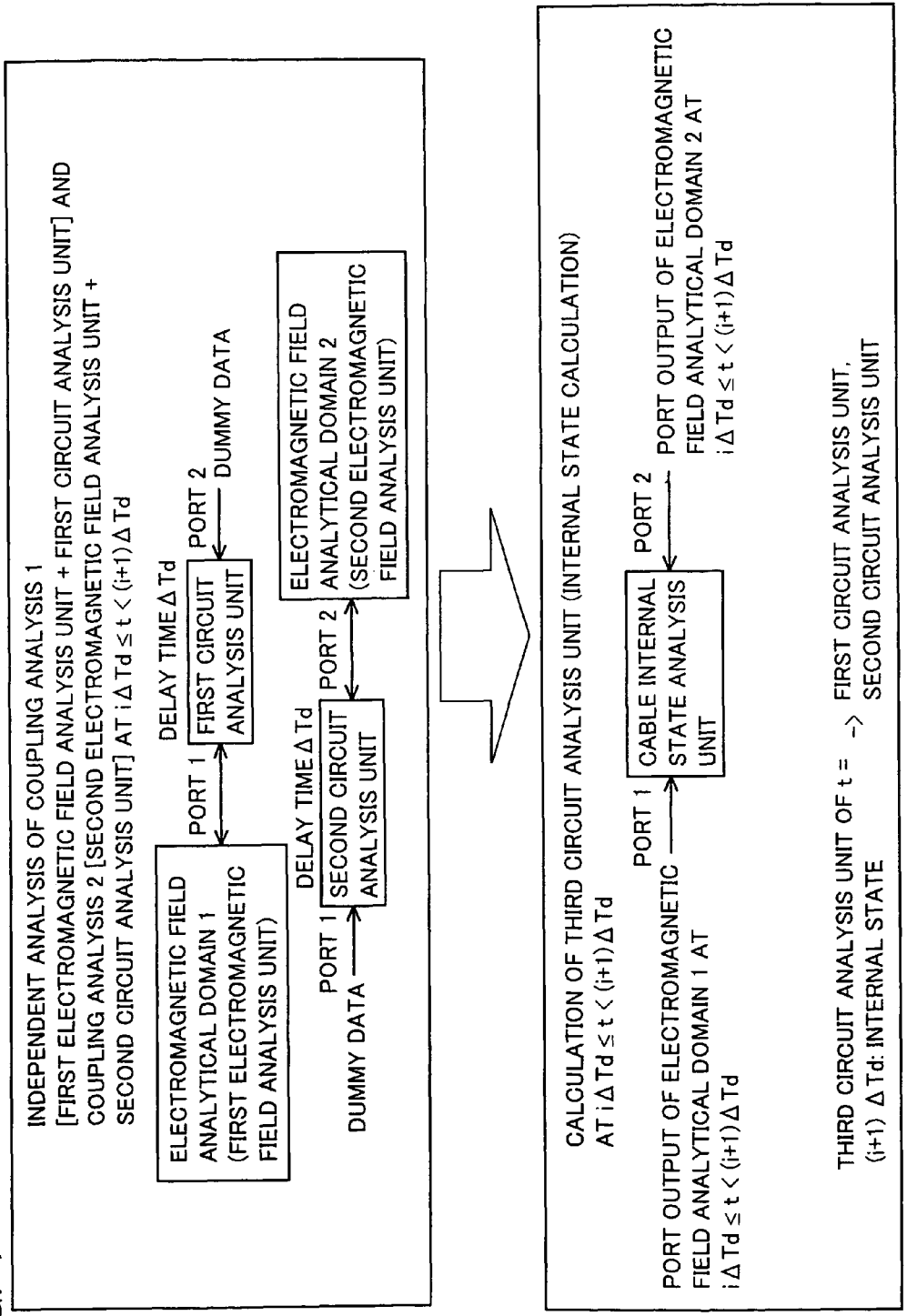
FIG. 4 is a conceptual diagram representing the flow of the coupling analysis procedure.

FIG. 4 is a conceptual diagram representing the flow of such a coupling analysis procedure.

By carrying out an analysis for every analysis time range of $i\Delta Td \leq t < (i+1)\Delta Td$ through the procedure set forth below, as shown in FIG. 4, a coupling analysis of electromagnetic field analysis/circuit analysis can proceed properly.

Firstly, at electromagnetic field analytical domain 1 that is an analysis space including the first substrate, first electromagnetic field analysis unit 224 carries out an electromagnetic field analysis by the FDTD method after setting the cell size and the time step $T_A$ according to the spatial fineness required for an analysis on the first substrate. At this stage, information coupling and current value storage are executed corresponding to the voltage and current input/output timing by the current source method between the first substrate and port 1 that connects the circuit analysis problem. In addition, first circuit analysis unit 226 proceeds with the first circuit analysis during analysis time range $i\Delta Td \leq t < (i+1)\Delta Td$. It is to be noted that dummy data (for example, a predetermined constant value) is applied to port 2 at this stage.

Similarly, at electromagnetic field analytical domain 2 that is an analysis space including the second substrate, second electromagnetic field analysis unit 234 carries out an electromagnetic field analysis by the FDTD method after setting the cell size and time step $T_B$ according to the fineness of the second substrate. At this stage, information coupling and current value storage are executed corresponding to the voltage and current input/output timing by the current source method between the second substrate and port 2 that connects the circuit analysis problem. In addition, second circuit analysis unit 236 proceeds with the second circuit analysis during analysis time range $i\Delta Td \leq t < (i+1)\Delta Td$. It is to be noted that dummy data (for example, a predetermined constant value) is applied to port 1 at this stage.

Using the current value that is saved at the current input timing by the current source method at the two analysis spaces, and that is input at the first and second circuit analyses, cable internal state analysis unit 240 carries out the third circuit analysis during analysis time range $i\Delta Td \leq t < (i+1)\Delta Td$.

Then, the internal state of the third circuit analysis at time $(i+1)\Delta Td$ is assigned to the internal states of the first and second circuit analyses.

Figure 5:
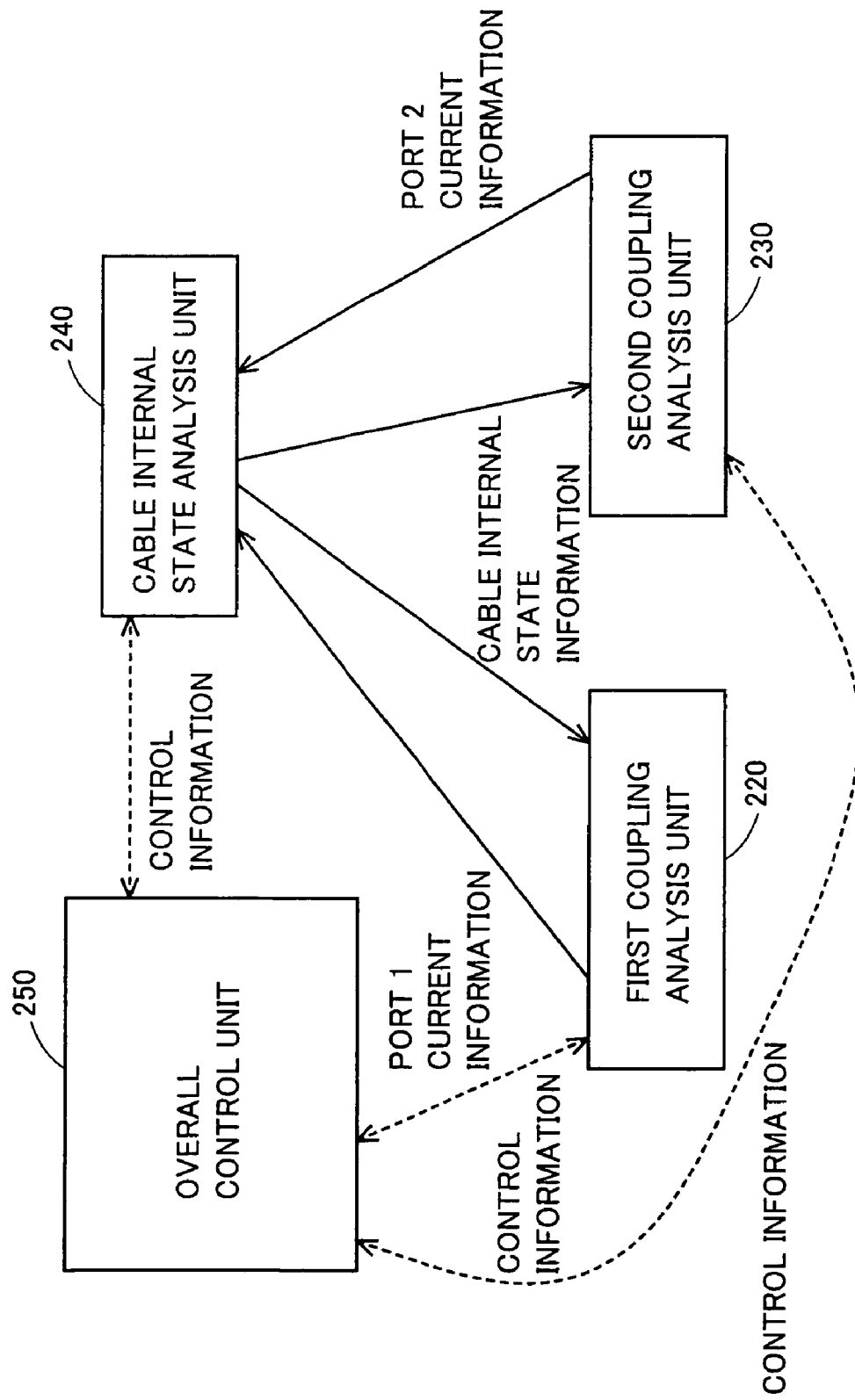
FIG. 5 represents the functional configuration and information flow at a CPU functioning as a coupling analysis apparatus of the present invention.

FIG. 5 represents a functional configuration of CPU 120 functioning as a coupling analysis apparatus of the present invention and information flow.

Referring to FIG. 5, CPU 120 provides an overall control unit 250 conducting overall control, a first coupling analysis unit 220, a second coupling analysis unit 230, and a cable internal state analysis unit 240 carrying out a circuit analysis on the cable to obtain the internal state of the cable. First coupling analysis unit 220 carries out a coupling analysis of a cable circuit analysis to calculate an analysis value for electromagnetic field analytical domain 1 that is the analysis space and for port 1 present on electromagnetic field analytical domain 1. Second coupling analysis unit 230 carries out a coupling analysis of a cable circuit analysis to calculate an analysis value for electromagnetic field analytical domain 2 that is the analysis space and for port 2 present on electromagnetic field analytical domain 2.

As described with reference to FIG. 4, cable internal state analysis unit 240 calculates the internal state of the cable (distribution of the current value and voltage value in the cable) based on the current information of port 1 from first coupling analysis unit 220 and the current information of port 2 from second coupling analysis unit 230. The calculated results are output as the internal states (current value) of port 1 and port 2 for the computation of the next time step at first coupling analysis unit 220 and second coupling analysis unit 230, respectively. The internal states of ports 1 and 2 calculated by cable internal state analysis unit 240 are temporarily written into port current cable internal state storage unit 206, and then passed over to first coupling analysis unit 220 and second coupling analysis unit 230.

Figure 6:
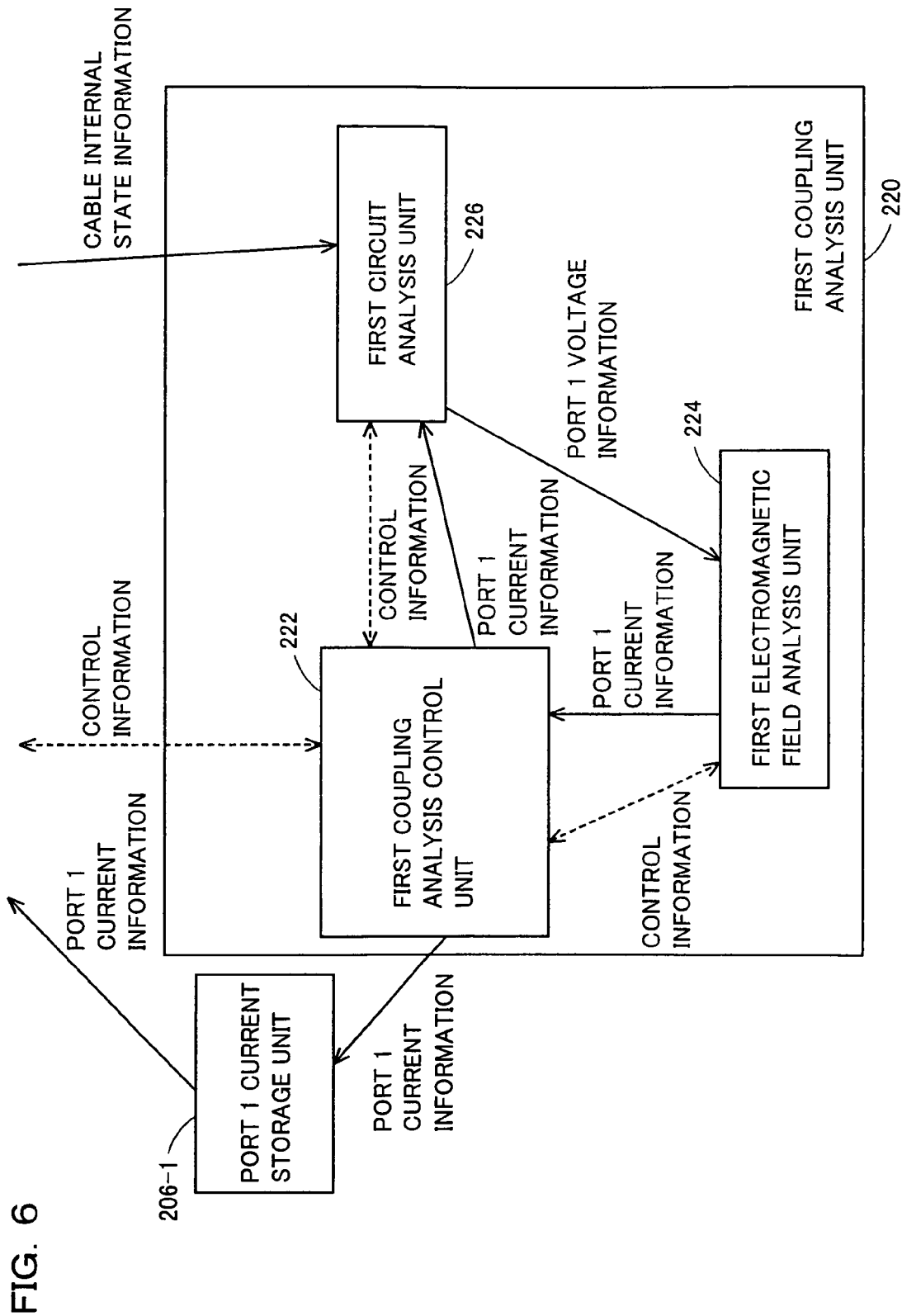
FIG. 6 represents a functional configuration and information flow at a first coupling analysis unit.
Figure 7:
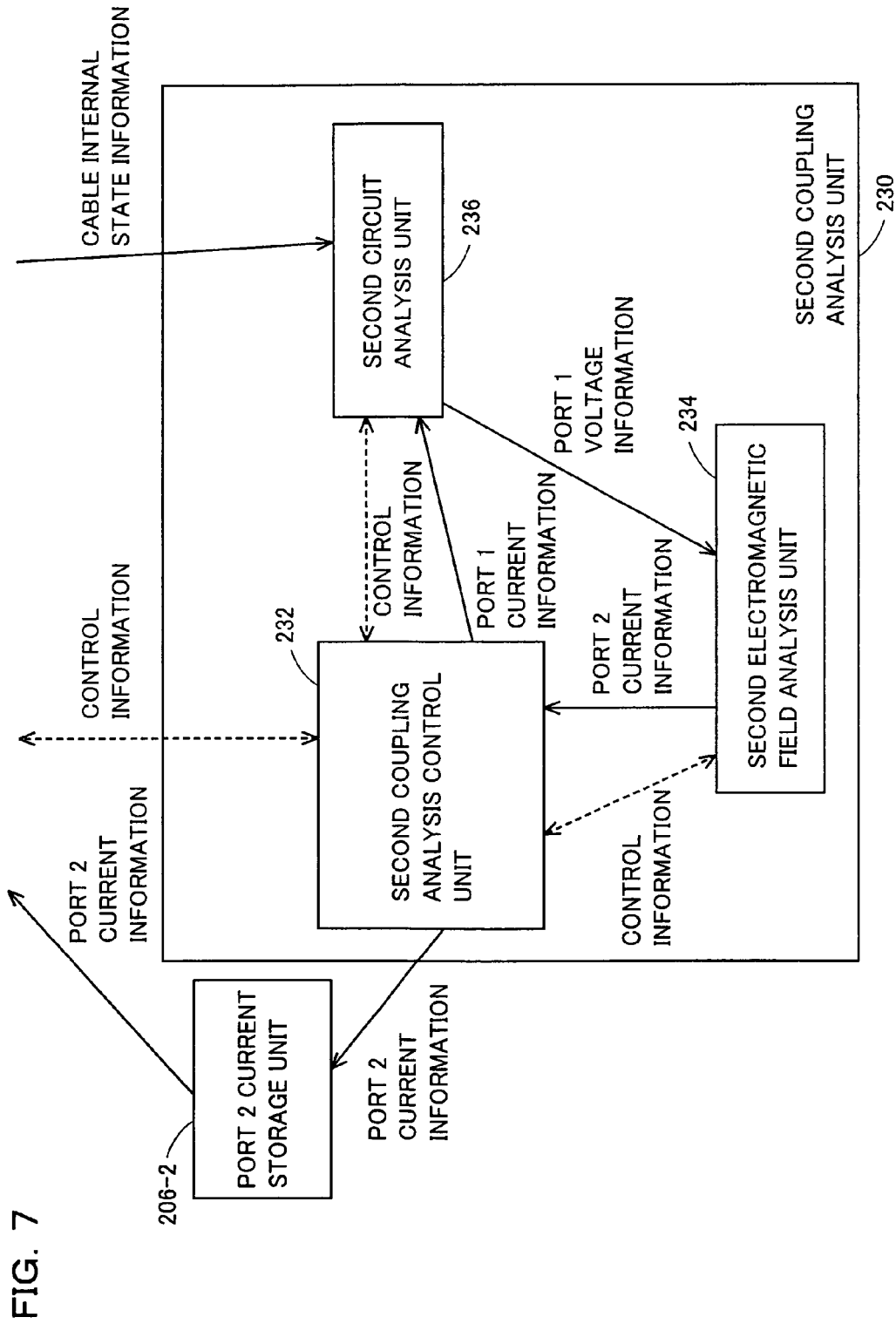
FIG. 7 represents a functional configuration and information flow at a second coupling analysis unit.

FIG. 6 represents the functional configuration of first coupling analysis unit 220 and information flow, whereas FIG. 7 represents the functional configuration of second coupling analysis unit 230 and the information flow.

As shown in FIG. 6, first coupling analysis unit 220 includes a first electromagnetic field analysis unit 224, a first circuit analysis unit 226, and a first coupling analysis control unit 222 for control of first electromagnetic field analysis unit 224 and first circuit analysis unit 226. First electromagnetic field analysis unit 224 carries out an electromagnetic field analysis of electromagnetic field analytical domain 1 that is the analysis space. First circuit analysis unit 226 carries out a cable circuit analysis to calculate the analysis value for port 1 present on electromagnetic field analysis domain 1 that is the analysis space, implemented by coupling with first electromagnetic field analysis unit 224. The current value of port 1 at each time is stored in a port 1 current storage unit 206-1 in port current cable internal state storage unit 206.

Similarly, as shown in FIG. 7, second coupling analysis unit 230 includes a second electromagnetic field analysis unit 234, a second circuit analysis unit 236, and a second coupling analysis control unit 232 carrying out control of second electromagnetic field analysis unit 234 and second circuit analysis unit 236. Second electromagnetic field analysis unit 234 carries out an electromagnetic field analysis of electromagnetic field analytical domain 2 that is the analysis space. Second circuit analysis unit 236 carries out a circuit analysis on the cable to calculate an analysis value for port 2 present on electromagnetic field analytical domain 2 that is the analysis space, implemented by coupling with second electromagnetic field analysis unit 234. The current value of port 2 at each time is stored in a port 2 current storage unit 206-2 in port current cable internal state storage unit 206.

Figure 8:
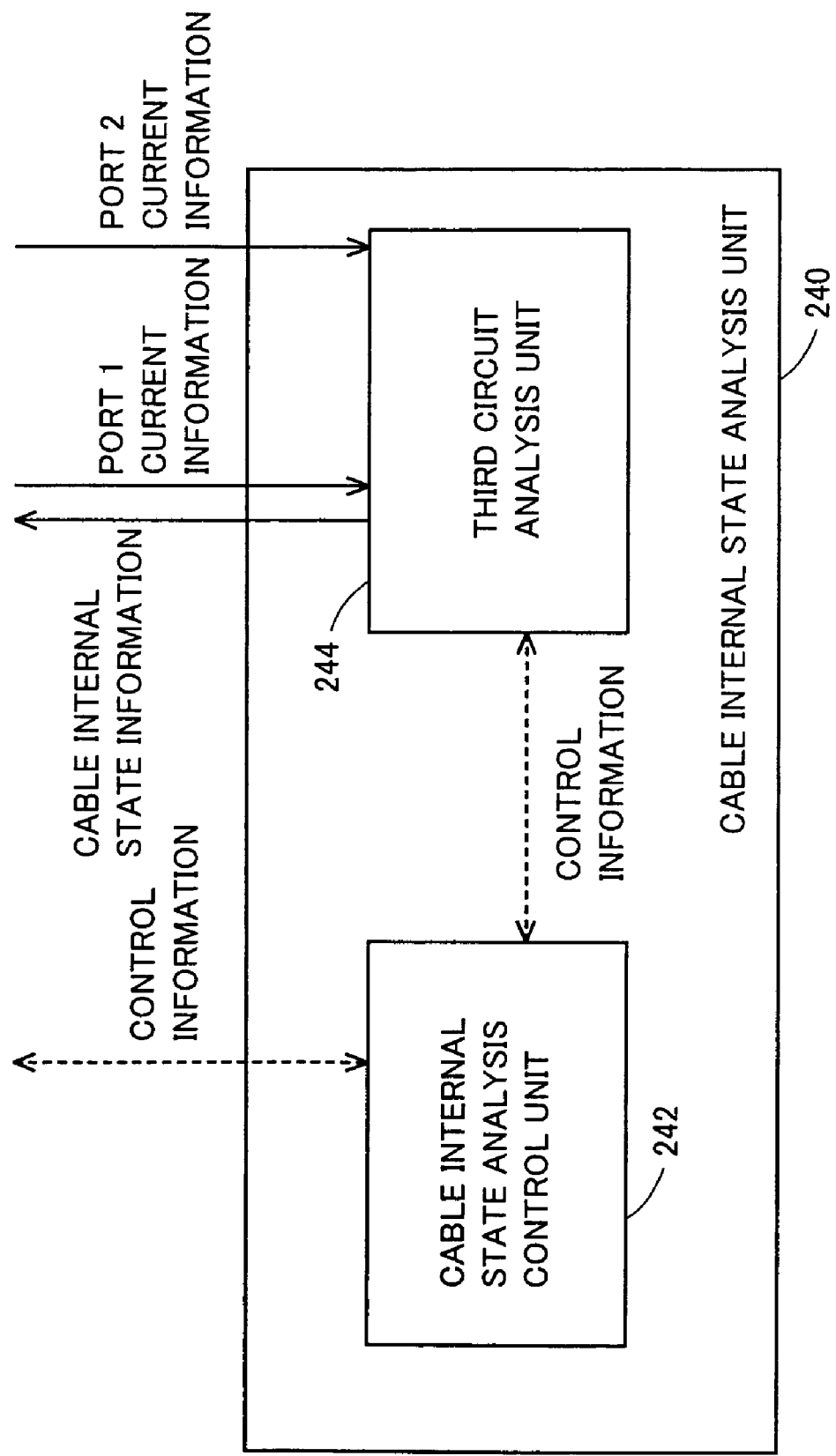
FIG. 8 represents a functional configuration and information flow at a cable internal state analysis unit.

FIG. 8 represents the functional configuration of cable internal state analysis unit 240 and information flow.

As shown in FIG. 8, cable internal state analysis unit 240 includes a third circuit analysis unit 244 calculating an accurate internal state for the cable circuit analysis, and a cable internal state analysis control unit 242 to effect control of third circuit analysis unit 244.

An operation of the coupling analysis apparatus will be described hereinafter.

Figure 9:
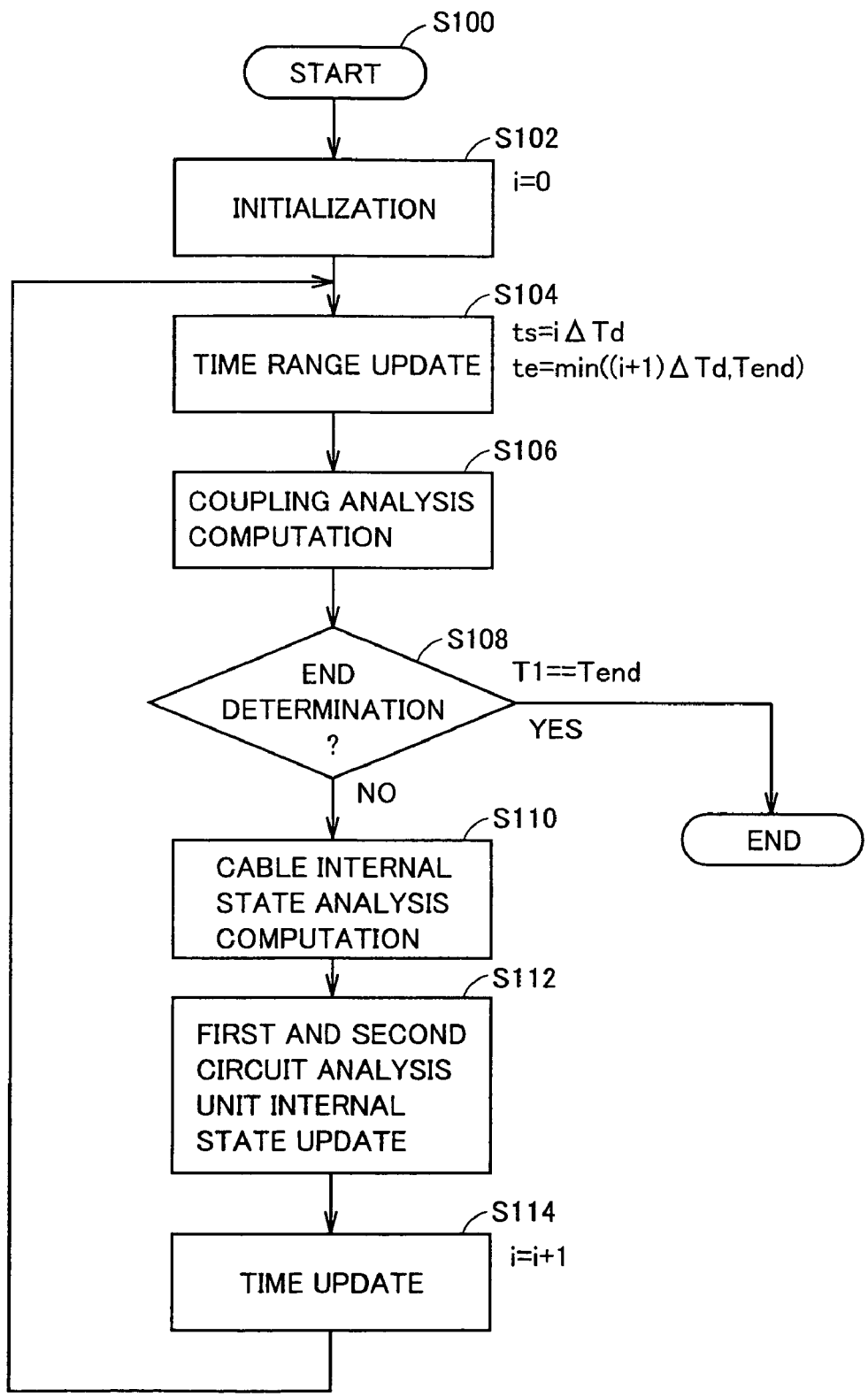
FIG. 9 is a flowchart representing an operation of the overall control unit.

FIG. 9 is a flowchart representing the operation of overall control unit 250. Respective processes will be described hereinafter.

[Initialization]

At step S102, overall control unit 250 executes an initialization process set forth below on the basis of information in the analysis condition input file describing the analysis settings.

Specifically, overall control unit 250 reads out from the analysis condition input file a calculation time step $\Delta T1$ for electromagnetic field analytical domain 1 that is the analysis space, calculation time step $\Delta T2$ for electromagnetic field analytical domain 2 that is the analysis space, and time interval $\Delta Td$ to run the analysis of the two domains independently. It is assumed that the values are set to satisfy $0 < \Delta Td < \Delta Td0$ where $\Delta Td0$ is the delay time for the circuit of the cable. Moreover, variables n, m and i representing the current time of first electromagnetic field analysis unit 224, second electromagnetic field analysis unit 234, and the overall analysis, respectively, are all initialized to 0.

[Update of Time Range]

At step S104, overall control unit 250 updates the time range for preceding with the analysis of the two domains independently based on the current i value. The start point ts of the time range is calculated by the following expression.

$$ts = i\Delta Td \tag{6}$$

Further, the end point te of the time range is calculated by the following equation.

$$te = \min((i+1)\Delta Td, \text{Tend}) \tag{7}$$

where Tend is the ending time of the entire analysis.

[Coupling Analysis Computation]

At step S106, overall control unit 250 outputs an analysis execution instruction of the time range ts≦t<te to the first and second coupling analysis units, and waits until the end of the calculation.

[End Determination]

At step S108, overall control unit 250 ends the analysis when the determination expression is, for example, te==Tend in the case of C++ language.

[Cable Internal State Analysis Computation]

In the case where the analysis has not ended, control proceeds to step S110 where overall control unit 250 issues an analysis execution instruction of the time range ts≦t<te to the cable internal state analysis unit, and waits until the calculation ends. The cable internal state analysis unit proceeds with the analysis based on the port current during ts≦t<te that was output in association with the computation by the two coupling analysis units to update the cable internal state.

[Internal State Update of First and Second Circuit Analysis Units]

At step S112, overall control unit 250 issues an instruction to first and second coupling analysis units 220 and 230 to overwrite the internal state of first and second circuit analysis units 226 and 236 with the internal state calculated by third circuit analysis unit 244 of cable internal state analysis unit 240.

[Time Update]

At step S114, overall control unit 250 adds 1 to i representing the number of the time range. Then, control proceeds to the time range update process.

Figure 10:
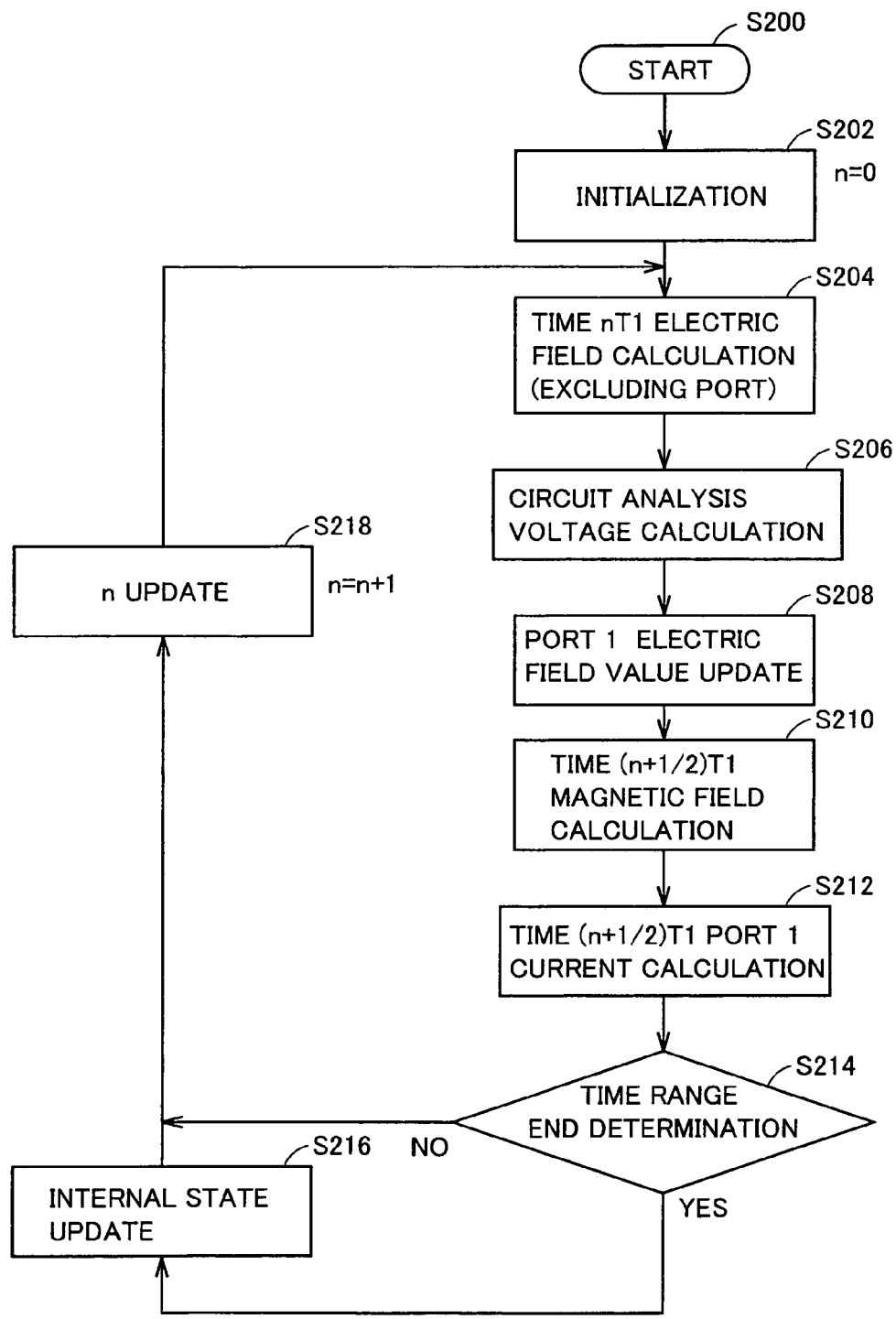
FIG. 10 is a flowchart representing an operation of the first coupling analysis unit.

FIG. 10 is a flow chart representing an operation of first coupling analysis unit 220. Respective processing will be described hereinafter.

[Initialization]

At step S202, first coupling analysis control unit 222 issues an initialization instruction to first electromagnetic field analysis unit 224 according to an instruction from overall control unit 250 to initialize the factor to proceed with the calculation of electromagnetic field analytical domain 1 that is the analysis space, and to initialize electric field/magnetic field variables. First coupling analysis control unit 222 also issues a similar initialization instruction to first circuit analysis unit 226 to initialize the internal state of the circuit analysis.

The current analysis time tcs1 of first circuit analysis unit 226 is initialized to 0. Further, current value I1 of port 1 is initialized to a preset value.

[Time nT1 Electric Field Calculation (Excluding Port)]

At step S204, first coupling analysis control unit 222 issues an instruction to first electromagnetic field analysis unit 224 to carry out an electric field calculation of time nT1 for the electric field of electromagnetic field analytical domain 1 excluding port 1.

[Calculation of Circuit Analysis Voltage]

At step S206, first coupling analysis control unit 222 issues an instruction to first circuit analysis unit 226 to carry out a circuit analysis with the current value of port 1 as I1 from current analysis time tcs1 to nT1 of first circuit analysis unit 226 to obtain a voltage value V1 of port 1 at time nT1. At this stage, an arbitrary value is set for the value of I2 (for example, I2=0) to proceed with the analysis. Then, tcs1 is updated to nT1.

[Update of Port 1 Electric Field Value]

At step S208, first coupling analysis control unit 222 calculates an electric field variable E1 of port 1 at electromagnetic field analysis domain 1 from a size $\Delta z1$ and voltage value V1 of port 1 such as $E1=V1/\Delta z1$.

[Time (n+½) T1 Magnetic Field Calculation]

At step S210, first coupling analysis control unit 222 issues an instruction to first electromagnetic field analysis unit 224 to carry out a magnetic field calculation of time (n+½) T1 for the electric field of electromagnetic field analytical domain 1.

[Time (n+½) T1 Port 1 Current Calculation]

At step S212, first coupling analysis control unit 222 calculates current I1 of port 1 from the electromagnetic field value around port 1 according to an expression of I1=A×H, and stores the obtained value as current value I1 of port 1 at time (n+½) T1 in port 1 current storage unit 206-1.

[Determination of Time Range End]

At step S214, first coupling analysis control unit 222 causes control to proceed to the [internal state update] process of step S216 when (n+½) T1≦te is "true". When (n+½) T1≦te is "false", first coupling analysis control unit 222 causes control to proceed to the [n update] process of step S218.

[Internal State Update]

At step S216, first coupling analysis control unit 222 delivers information representing that the time range calculation has ended to overall control unit 250, and waits until an internal state update instruction is issued. In response to an output of an internal state update instruction, first coupling analysis control unit 222 overwrites the internal state stored in first circuit analysis unit 226 with the internal state received from third circuit analysis unit 244. Further, first coupling analysis control unit 222 overwrites the value of the current analysis time tcs1 of circuit analysis unit 1 with the current analysis time value tcs3 of circuit analysis unit 3.

[n Update]

At step S218, first coupling analysis control unit 222 adds 1 to n, and causes control to proceed to the [time nT1 electric field calculation (excluding port)] process of step S204.

The operation of second coupling analysis unit 230 is similar to the operation of first coupling analysis unit 220. Therefore, detailed description thereof will not be repeated.

Figure 11:
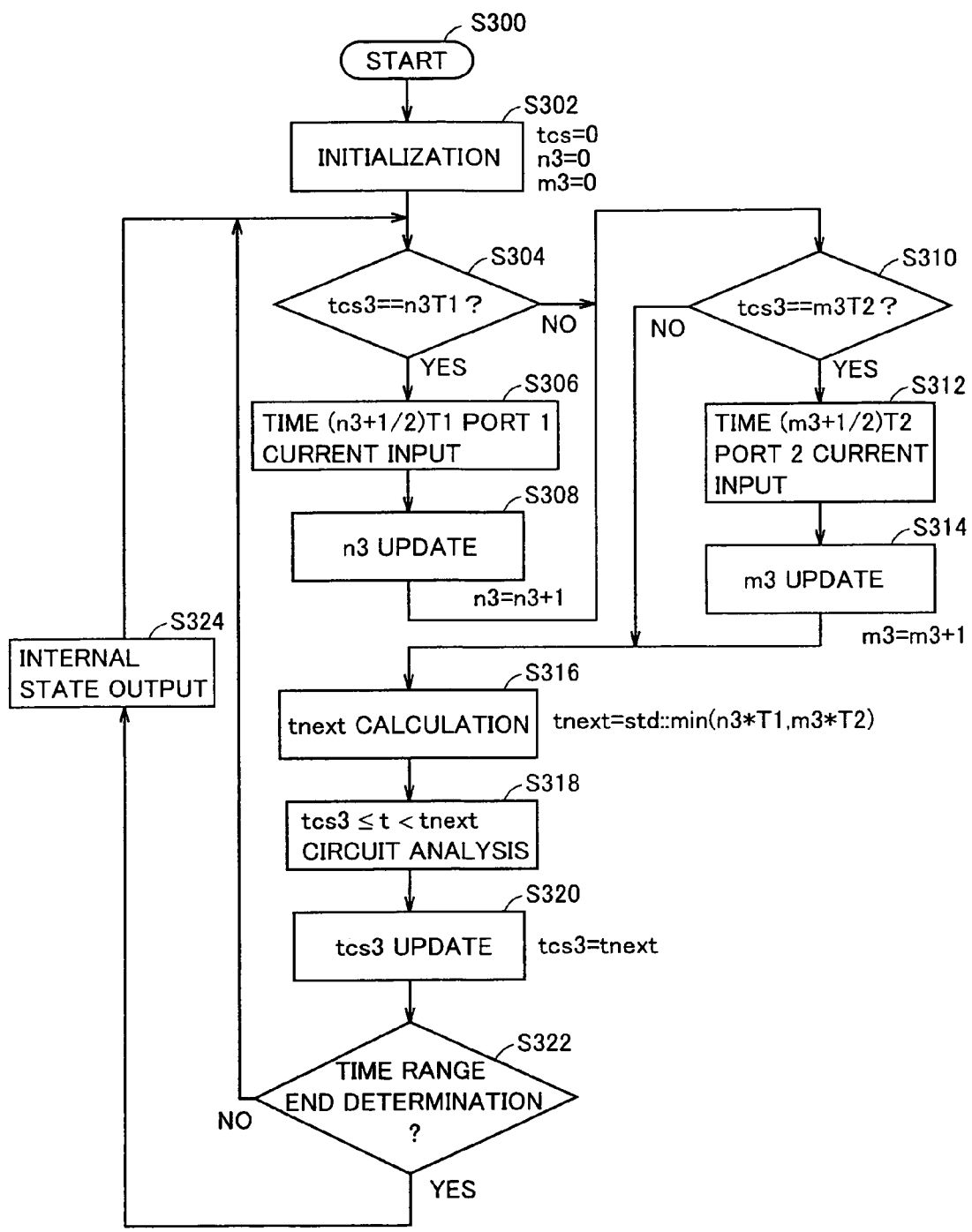
FIG. 11 is a flowchart representing an operation of the cable internal state analysis unit.

FIG. 11 is a flowchart representing an operation of cable internal state analysis unit 240. Respective processing will be described hereinafter with reference to FIG. 11.

[Initialization]

At step S302, cable internal state analysis control unit 242 responds to an instruction from overall control unit 250 to initialize current analysis time tcs3, n3 and m3 of third circuit analysis unit 244 all to 0. Further, the internal state of third circuit analysis unit 244 is initialized.

[I1 Input]

When current analysis time tcs3 of third circuit analysis unit 244 matches n3*T1 at step S304, cable internal state analysis control unit 242 sets the value of port current I1 at time (n3+½)*T1 as the new value I1 calculated by third circuit analysis unit 244 (step S306); otherwise, cable internal state analysis control unit 242 proceeds to the [I2 input] process of step S310.

[n3 Update]

At step S308, cable internal state analysis control unit 242 adds 1 to step variable n3.

[I2 Input]

When current analysis time tcs3 of third circuit analysis unit 244 matches m3*T2 at step S310, cable internal state analysis control unit 242 sets the value of port current I2 at time (m3+½)*T2 as the new I2 calculated by third circuit analysis unit 244 (step S312); otherwise, cable internal state analysis control unit 242 proceeds to the [tnext update] process of step S316.

[m3 Update]

At step S314, cable internal state analysis control unit 242 adds 1 to m3.

[tnext Computation]

At step S316, cable internal state analysis control unit 242 calculates the next interruption time tnext of third circuit analysis unit 244 by the following equation, for example, in the case of C++ language:

$$tnext = std::min(n3*T1, m3*T2).$$

[tcs3≦t<tnext Circuit Analysis]

At step S318, third circuit analysis unit 244 carries out the circuit analysis during time tcs3≦t<tnext using current port currents I1 and I2.

[tcs3 Update]

At step 320, cable internal state analysis control unit 242 sets the value of tnext as the new value of current analysis time tcs3 of third circuit analysis unit 244.

[Determination of Time Range End]

At step S322, cable internal state analysis control unit 242 proceeds to the [internal state output] process of step S324 when the determination of the following expression, in the case of C++ language, for example, $$te \leq std::min((n3+1)*T1, (m3+1)*T1)$$

is "true". In the case where this determination is "false", control returns to the [I1 input] process of step S304.

[Internal State Output]

At step S324, cable internal state analysis control unit 242 outputs the internal state of third circuit analysis unit 244 and the value of tcs3 to first and second coupling analysis units 220 and 230. Then, cable internal state analysis control unit 242 waits until a new time range calculation instruction is issued from overall control unit 250. In response to such a calculation instruction, cable internal state analysis control unit 242 proceeds to the [I1 input] process of step S304.

By applying such processing in the case where two structures having electrical coupling such as two substrates and a cable establishing connection therebetween are to be analyzed, and the possibility of mutual effect caused by electromagnetic coupling is low, the required computer resource and analyzing time can be reduced.

Moreover, by carrying out an analysis using a different cell size depending upon the fineness of the structure included in each of two electromagnetic field analytical domains, the required computer resource and analyzing time can be further reduced. In addition, in the case where the constraint in the computer resource causes the two electromagnetic field analyses to be executed alternately with the intermediate internal state on the same computer saved in an external storage device or the like and then exchanged, the analysis can be performed efficiently due to the lower number of exchanges. Alternatively, in the case where two electromagnetic field analyses are performed at two computers remote from each other on a network basis, the analysis can be performed efficiently due to the lower transmission frequency.

By virtue of the present embodiment, emission from a substrate and the electromagnetic field distribution in the substrate can be obtained directly. Therefore, the noise conveyed from a certain signal line to another signal line in the substrate can also be obtained.

The above description is based on the case where a circuit analysis and an electromagnetic field analysis are coupled by an equivalent current source model when the method is to be implemented by coupling. Alternatively, the circuit analysis and electromagnetic field analysis may be coupled by an equivalent voltage source model. In this case, the coupling analysis of circuit analysis and electromagnetic field analysis can be implemented by the bidirectional conversion of the electric field value and the voltage value, or by the bidirectional conversion of the magnetic field value and the current value. Therefore, in the case where one of the electric field value or magnetic field value to be converted is referred to in the coupling analysis of the circuit analysis and electromagnetic field analysis, it will be generically termed "electromagnetic field value".

The present embodiment has been described based on the procedure of performing an analysis implemented by coupling an electromagnetic field analysis and circuit analysis together for two circuit substrates and a circuit element that electrically couples the two substrates. The number of such subjects of analysis is not limited to the two circuit substrates set forth above.

Further, although the above description is based on a specific case of a cable as "the circuit element for coupling", the condition for properly carrying out the calculation according to the method of the present invention requires only the presence of a finite delay time between the two ports of the circuit element. The output value at port 1 of the first circuit analysis unit and the value at port 1 of the third circuit analysis unit will match, with the exception of a calculation error occurring in the circuit analysis, since they are immune to the input value at port 2 during the delay time even if an active device such as a transistor or power supply is included in addition to a passive circuit. Similarly, the output value at port 2 of the second circuit analysis unit and the value at port 2 of the third circuit analysis unit will match since they are immune to the input value of port 1 during the delay time. Therefore, the internal state of the third circuit analysis unit will match the internal state of the cable circuit analysis when an analysis is performed based on synchronization of the electromagnetic field analysis of substrate 1, the electromagnetic field analysis of substrate 2, and the circuit analysis of the cable. Therefore, if there is a "circuit element such as a transmission line having a finite delay time" as the "circuit element for coupling", the present invention can be applied to any structure as long as a finite delay time is generated in the internal structure. Examples of a structure in which a finite delay time is generated include the transmission line model (T element) and LC ladder circuit of Berkeley SPICE. The invention of the present application is applicable to any circuit element model having a finite delay time between two ports by internally including such structures. Therefore, as a more specific representation of a "circuit element for coupling", it can be said that the present invention is applicable to "any circuit element having a finite delay time between two ports by including a structure in which a delay time is generated such as a transmission line model (T element) or LC ladder circuit employed in Berkeley SPICE and the like".

Although the present invention has been described and illustrated in detail, it is clearly understood that the same is by way of illustration and example only and is not to be taken by way of limitation, the scope of the present invention being interpreted by the terms of the appended claims.

What is claimed is:

1. A simulation method for executing an electromagnetic field circuit coupling analysis on a first target of analysis and a second target of analysis electrically coupled via a circuit element that has a finite delay time, comprising:
   a first electromagnet field analysis step of carrying out of a time domain electromagnetic field analysis at a first an analytical domain including said first target of analysis,
   a first circuit analysis step of carrying out a circuit analysis on said circuit element at said first analytical domain, implemented by coupling with said first electromagnetic field analysis step, a second electromagnetic field analysis stop of carrying out at time domain electromagnetic field analysis at a second analytical domain including said second target of analysis, a second circuit analysis step of carrying out a circuit analysis on said circuit element at said second analytical domain, implemented by coupling with said second electromagnetic field analysis step, a third circuit analysis step of carrying out a circuit analysis on said circuit element, employing an electromagnetic field value obtained at said first electromagnetic field analysis step, at one terminal of said circuit element connecting said first target of analysis and said circuit element, and an electromagnetic field value obtained at said second electromagnetic field analysis step at an other terminal of said circuit element connecting said second target of analysis step at an other terminal of said circuit element connecting said second target of analysis and said circuit element, and a coupling step of replacing an internal state of said first circuit analysis step and said second circuit analysis step with the internal state calculated at said third circuit analysis step.

2. The simulation method according to claim 1, further comprising:

a first conversion step of converting bidirectionally an electric field value or magnetic field value obtained at said first electromagnetic field analysis step to a voltage value or current value at one terminal of said circuit element connecting said first target of analysis and said circuit element, a first storage step of storing the electric field value or magnetic field value obtained at said first electromagnetic field analysis step, or the voltage value or current value obtained at said first conversion step, at one terminal of said circuit element connecting said first target of analysis and said circuit element, a second conversion step of converting bidirectionally an electric field value or magnetic field value obtained at said second electromagnetic field analysis step to a voltage value or current value, at an other terminal of said circuit element connecting said second target of analysis and said circuit element, and a second storage step of storing the electric field value or magnetic field value obtained at said second electromagnetic field analysis step, or the voltage value or current value obtained at said second conversion step, at the other terminal of said circuit element connecting said second target of analysis and said circuit element, wherein said third circuit analysis step includes carrying out said circuit analysis on said circuit element, based on information of the two terminals stored at said first and second storage steps.

3. The simulation method according to claim 1, wherein said time domain electromagnetic field analysis is executed employing an FDTD method.

4. A simulation apparatus for executing an electromagnetic field circuit coupling analysis on a first target of analysis and a second target of analysis electrically coupled via a circuit element that has a finite delay time, comprising:

a first electromagnetic field analysis unit carrying out a time domain electromagnetic field analysis at a first analytical domain including said first target of analysis, a first circuit analysis unit carrying out a circuit analysis on said circuit element at said first analytical domain, coupling with said first electromagnetic field analysis unit, a second electromagnetic field analysis unit carrying out a time domain electromagnetic field analysis at a second analytical domain including said second target of analysis, a second circuit analysis unit carrying out a circuit analysis on said circuit element at said second analytical domain, coupled with said second electromagnetic field analysis unit, a third circuit analysis unit carrying out a circuit analysis on said circuit element, employing an electromagnetic field value obtained at said first electromagnetic field analysis unit at one terminal of said circuit element connecting said first target of analysis and said circuit element, and an electromagnetic field value obtained at said second electromagnetic field analysis unit at an other terminal of said circuit element connecting said second target of analysis and said circuit element, and a coupling unit replacing an internal state of said first circuit analysis unit and said second circuit analysis unit with the internal state calculated at said third circuit analysis unit.

5. The simulation apparatus according to claim 4, further comprising:

a first conversion unit converting bidirectionally an electric field value or magnetic field value obtained by said first electromagnetic field analysis unit to a voltage value or current value at one terminal of said circuit element connecting said first target of analysis and said circuit element, a first storage unit storing the electric field value or magnetic field value obtained by said first electromagnetic field analysis unit, or the voltage value or era en value obtained a said first conversion unit, at one terminal of said circuit element connecting said first target of analysis and said circuit element, a second conversion unit converting bidirectionally an electric field value or magnetic field value obtained by said second electromagnetic field analysis unit to a voltage value or current value, at an other terminal of said circuit element connecting said second target of analysis and said circuit element, and a second storage unit storing the electric field value or magnetic field value obtained by said second electromagnetic field analysis unit, or the voltage value or current value obtained by said second conversion unit, at the other terminal of said circuit element connecting said second target of analysis and said circuit element, wherein said third circuit analysis unit carries out said circuit analysis on said circuit element based on information of the two terminals stored by said first and second storage units.

6. The simulation apparatus according to claim 4, wherein said time domain electromagnetic field analysis is executed employing FDTD.

7. A non-transitory computer-readable medium storing a simulation program for executing an electromagnetic field circuit coupling analysis on a first target of analysis and a second target of analysis electrically coupled via a circuit element that has a finite delay time, said simulation program causing a computer to execute:

a first electromagnetic field analysis step of carrying out at time domain electromagnetic field analysis at a first analytical domain including said first target of analysis, a first circuit analysis step of carrying out a circuit analysis on said circuit element at said first analytical domain, implemented by coupling with said first electromagnetic field analysis step, a second electromagnetic field analysis step of carrying out a time domain electromagnetic field analysis at a second analytical domain including said second target of analysis, a second circuit step of carrying out a circuit analysis on said circuit element at said second analytical domain, implemented by coupling with said second electromagnetic field analysis step, a third circuit analysis step of carrying out a circuit analysis on said circuit element, employing an electromagnetic field value obtained at said first electromagnetic field analysis step, at one terminal of said circuit element connecting said first target of analysis and said circuit element, and an electromagnetic field value obtained at said second electromagnetic field analysis step at an other terminal of said circuit element connecting said second target of analysis and said circuit element, and a coupling step of replacing an internal state of said first circuit analysis step and said second circuit analysis step with the internal state calculated at said third circuit analysis step.

8. The non-transitory computer-readable medium storing a simulation program for executing an electromagnetic field circuit coupling analysis on a first target of analysis and a second target of analysis electrically coupled via a circuit element that has a finite delay time according to claim 7, wherein said time domain electromagnetic field analysis is executed employing an FDTD method.

9. The non-transitory computer-readable medium storing a simulation program for executing an electromagnetic field circuit coupling analysis on a first target of analysis and a second target of analysis electrically coupled via a circuit element that has a finite delay time according to claim 7, said simulation program causing a computer to further execute:

a first conversion step of converting bidirectionally an electric field value or magnetic field value obtained at said first electromagnetic field analysis step to a voltage value or current value at one terminal of said circuit element connecting said first target of analysis and said element, a first storage step of storing the electric field value or magnetic field value obtained at said first electromagnetic field analysis step, or the voltage value or current value obtained at said first conversion step, at one terminal of said circuit element connecting said first target of analysis and said circuit element, a second conversion step of converting bidirectionally electric field value or magnetic field value obtained at said second electromagnetic field analysis step to a voltage value or current value, at an other terminal of said circuit element connecting said second target of analysis and said circuit element, and a second storage step of storing the electric field value or magnetic field value obtained at said second electromagnetic field analysis step, or the voltage value or current value obtained at said second conversion step, at the other terminal of said circuit element connecting said second target of analysis and said circuit element, wherein said third circuit analysis step includes carrying out said circuit analysis on said circuit element, based on information of the two terminals stored at said first and second storage steps.

* * * * *